US012749652B2

(12) United States Patent
Alskran

(10) Patent No.: US 12,749,652 B2
(45) Date of Patent: Sep. 29, 2026

(54) PULSE-MODE CONTROL IN A BIAS SUPPLY

(71) Applicant: Advanced Energy Industries, Inc., Denver, CO (US)

(72) Inventor: Faleh Alskran, Timnath, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 1 day.

(21) Appl. No.: 18/794,876

(22) Filed: Aug. 5, 2024

(65) Prior Publication Data

US 2026/0038767 A1 Feb. 5, 2026

(51) Int. Cl.
*H01J 37/32* (2006.01)

(52) U.S. Cl.
CPC .. *H01J 37/32174* (2013.01); *H01J 37/32128* (2013.01); *H01J 37/32935* (2013.01)

(58) Field of Classification Search
None
See application file for complete search history.

(56) References Cited

U.S. PATENT DOCUMENTS 4,622,094 A 11/1986 Otsubo
4,693,805 A 9/1987 Quazi
4,798,650 A 1/1989 Nakamura et al.
4,891,118 A 1/1990 Ooiwa et al.
4,898,798 A 2/1990 Sugata et al.
4,963,239 A 10/1990 Shimamura et al.
5,057,185 A 10/1991 Thomas, III et al.
5,156,703 A 10/1992 Oechsner
5,160,397 A 11/1992 Doki et al.
5,179,264 A 1/1993 Cuomo et al.
5,242,561 A 9/1993 Sato
5,247,669 A 9/1993 Abraham et al.
5,250,165 A 10/1993 Berglund et al.
5,332,880 A 7/1994 Kubota et al.
5,410,691 A 4/1995 Taylor
5,415,718 A 5/1995 Ohmi et al.
5,427,669 A 6/1995 Drummond
5,487,785 A 1/1996 Horike et al.
5,517,084 A 5/1996 Leung (Continued)

FOREIGN PATENT DOCUMENTS

CN 1451172 A 10/2003
CN 1839459 A 9/2006

(Continued)

OTHER PUBLICATIONS

Heil, S.B.S., et al., "Deposition ofTIN and HfO2 in a Commercial 200mm Plasma Atomic Layer Deposition Reactor", J. Vac. Sci. Technol. A, Sep./Oct. 2007, Jul. 31, 2007, vol. 25, No. 5, pp. 1357-1366.

(Continued)

*Primary Examiner* — Srinivas Sathiraju
(74) *Attorney, Agent, or Firm* — NOD Law PC

(57) ABSTRACT

Bias supplies and bias control methods are disclosed. One method comprises applying, during an ON pulse, a waveform using switching in connection with a DC voltage, removing the DC voltage while circulating current during an OFF pulse, reapplying the DC voltage, in advance of another ON pulse, and initiating the switching after reapplying the DC voltage to reapply the waveform during another ON pulse.

19 Claims, 6 Drawing Sheets

(56) References Cited

U.S. PATENT DOCUMENTS 5,531,862 A 7/1996 Otsubo et al.
5,535,906 A 7/1996 Drummond
5,556,501 A 9/1996 Collins et al.
5,573,597 A 11/1996 Lantsman
5,683,072 A 11/1997 Ohmi et al.
5,705,931 A 1/1998 Klick
5,767,628 A 6/1998 Keller et al.
5,770,972 A 6/1998 Freuler et al.
5,815,366 A 9/1998 Morita et al.
5,859,428 A 1/1999 Fruchtman
5,907,221 A 5/1999 Sato et al.
5,936,481 A 8/1999 Fuji
5,983,828 A 11/1999 Savas
6,030,667 A 2/2000 Nakagawa et al.
6,041,734 A 3/2000 Raoux et al.
6,051,114 A 4/2000 Yao et al.
6,096,174 A 8/2000 Teschner et al.
6,110,287 A 8/2000 Arai et al.
6,129,806 A 10/2000 Kaji et al.
6,156,667 A 12/2000 Jewett
6,161,498 A 12/2000 Toraguchi et al.
6,162,709 A 12/2000 Raoux et al.
6,180,019 B1 1/2001 Kazumi et al.
6,201,208 B1 3/2001 Wendt et al.
6,273,022 B1 8/2001 Pu et al.
6,288,493 B1 9/2001 Leo et al.
6,291,938 B1 9/2001 Jewett
6,313,583 B1 11/2001 Arita et al.
6,326,584 B1 12/2001 Jewett et al.
6,333,738 B1 12/2001 Ide
6,392,210 B1 5/2002 Jewett et al.
6,463,875 B1 10/2002 Chen et al.
6,478,924 B1 11/2002 Shamouilian et al.
6,507,155 B1 1/2003 Barnes et al.
6,544,895 B1 4/2003 Donohoe
6,568,346 B2 5/2003 Pu et al.
6,583,572 B2 6/2003 Veltrop et al.
6,617,794 B2 9/2003 Bames et al.
6,621,674 B1 9/2003 Zahiringer et al.
6,646,385 B2 11/2003 Howald et al.
6,685,798 B1 2/2004 Howald et al.
6,694,915 B1 2/2004 Howald et al.
6,707,051 B2 3/2004 Shun'ko
6,714,033 B1 3/2004 Makhratchev et al.
6,724,148 B1 4/2004 Gonzalez et al.
6,756,737 B2 6/2004 Doi et al.
6,777,037 B2 8/2004 Sumiya et al.
6,794,301 B2 9/2004 Savas
6,819,096 B2 11/2004 Gonzalez et al.
6,822,396 B2 11/2004 Gonzalez et al.
6,863,018 B2 3/2005 Koizumi et al.
6,872,289 B2 3/2005 Mizuno et al.
6,885,153 B2 4/2005 Quon
6,885,453 B2 4/2005 Kaufmann
6,893,533 B2 5/2005 Holland et al.
6,913,938 B2 7/2005 Shanmugasundram et al.
6,920,312 B1 7/2005 Benjamin
6,924,455 B1 8/2005 Chen et al.
6,927,358 B2 8/2005 Gonzalez et al.
6,943,317 B1 9/2005 Ilic et al.
6,946,063 B1 9/2005 Gonzalez et al.
6,984,198 B2 1/2006 Krishnamurthy et al.
7,005,845 B1 2/2006 Gonzalez et al.
7,019,253 B2 3/2006 Johnson et al.
7,038,399 B2 * 5/2006 Lys .................... H05B 45/3577 315/307
7,046,524 B2 5/2006 Hoffman et al.
7,050,022 B2 5/2006 Kigo et al.
7,059,267 B2 6/2006 Hedberg et al.
7,096,819 B2 8/2006 Chen et al.
7,122,965 B2 10/2006 Goodman
7,132,618 B2 11/2006 Hoffman et al.
7,144,131 B2 * 12/2006 Rains ........................ F21V 7/26 362/231
7,145,125 B2 * 12/2006 May .......................... G01J 3/10 362/235
7,201,936 B2 4/2007 Schwarm et al.
7,245,084 B1 7/2007 Gonzalez et al.
7,253,117 B2 8/2007 Donohoe
7,292,047 B2 11/2007 Tanaka et al.
7,297,637 B2 11/2007 Hedberg et al.
7,352,138 B2 * 4/2008 Lys ...................... H05B 39/044 315/DIG. 4
7,373,899 B2 5/2008 Sumiya et al.
7,468,494 B2 12/2008 Gonzalez et al.
7,520,956 B2 4/2009 Samukawa et al.
7,528,386 B2 5/2009 Ruzic et al.
7,645,357 B2 1/2010 Paterson et al.
7,725,208 B2 5/2010 Shanmugasundram et al.
7,737,702 B2 6/2010 Pipitone
7,764,140 B2 7/2010 Nagarkatti et al.
7,768,477 B2 8/2010 Jung et al.
7,777,179 B2 8/2010 Chen et al.
7,783,375 B2 8/2010 Shanmugasundram et al.
7,811,939 B2 10/2010 Kushibiki et al.
7,847,247 B2 12/2010 Denpoh
7,928,664 B2 4/2011 Beland
8,012,306 B2 9/2011 Dhindsa
8,040,068 B2 10/2011 Coumou et al.
8,103,492 B2 1/2012 Brcka
8,140,292 B2 3/2012 Wendt
8,169,595 B2 5/2012 Schriever et al.
8,264,154 B2 9/2012 Banner et al.
8,319,436 B2 11/2012 Carter et al.
8,329,054 B2 12/2012 Ichino et al.
8,334,657 B2 12/2012 Xia
8,357,264 B2 1/2013 Shannon et al.
8,404,598 B2 3/2013 Liao et al.
8,409,398 B2 4/2013 Brcka
8,475,673 B2 7/2013 Edelberg
8,575,843 B2 11/2013 Moore et al.
8,641,916 B2 2/2014 Yatsuda et al.
8,674,606 B2 3/2014 Carter et al.
8,675,378 B2 * 3/2014 Beland .................. H02M 1/088 363/71
8,698,107 B2 4/2014 Godet et al.
8,742,669 B2 6/2014 Carter et al.
8,801,950 B2 8/2014 Lee
8,821,684 B2 9/2014 Ui et al.
8,900,402 B2 12/2014 Holland et al.
9,088,267 B2 7/2015 Blackburn et al.
9,105,447 B2 8/2015 Brouk et al.
9,114,666 B2 8/2015 Valcore, Jr. et al.
9,123,509 B2 9/2015 Papasouliotis et al.
9,177,756 B2 11/2015 Holland et al.
9,208,992 B2 12/2015 Brouk et al.
9,210,790 B2 12/2015 Hoffman et al.
9,226,380 B2 12/2015 Finley
9,275,836 B2 * 3/2016 Himori ............. H01J 37/32091
9,283,635 B2 3/2016 Peters
9,287,086 B2 3/2016 Brouk et al.
9,287,092 B2 3/2016 Brouk et al.
9,305,803 B2 4/2016 Morimoto et al.
9,309,594 B2 4/2016 Hoffman et al.
9,362,089 B2 6/2016 Brouk et al.
9,378,931 B2 6/2016 Kwon et al.
9,390,893 B2 7/2016 Valcore, Jr. et al.
9,425,029 B2 8/2016 Muto et al.
9,435,029 B2 9/2016 Brouk et al.
9,478,397 B2 10/2016 Blackburn et al.
9,536,749 B2 1/2017 Marakhtanov et al.
9,593,421 B2 3/2017 Back et al.
9,595,424 B2 3/2017 Marakhtanov et al.
9,604,877 B2 3/2017 Veerasamy et al.
9,667,211 B1 5/2017 Wyse et al.
9,685,297 B2 6/2017 Carter et al.
9,754,767 B2 9/2017 Kawasaki
9,754,768 B2 9/2017 Yamada et al.
9,761,414 B2 9/2017 Marakhtanov et al.
9,761,419 B2 9/2017 Nagami
9,767,988 B2 9/2017 Brouk et al.
9,788,405 B2 10/2017 Kawasaki et al.
9,818,584 B2 11/2017 Miller et al.

(56) References Cited

U.S. PATENT DOCUMENTS 9,872,373 B1 1/2018 Shimizu et al.
9,892,888 B2 2/2018 Back et al.
10,355,582 B2 * 7/2019 Braginsky ............ H02J 7/0025
10,448,494 B1 10/2019 Dorf et al.
10,448,495 B1 10/2019 Dorf et al.
10,555,412 B2 2/2020 Dorf et al.
10,565,563 B1 2/2020 Hays et al.
10,607,813 B2 3/2020 Fairbairn et al.
10,707,055 B2 7/2020 Shaw et al.
10,791,617 B2 9/2020 Dorf et al.
10,811,227 B2 10/2020 Van Zyl et al.
10,811,228 B2 10/2020 Van Zyl et al.
10,811,229 B2 10/2020 Van Zyl et al.
10,896,807 B2 1/2021 Fairbairn et al.
11,011,349 B2 5/2021 Brouk et al.
11,144,688 B1 10/2021 Ershov et al.
11,189,454 B2 11/2021 Carter et al.
11,264,209 B2 3/2022 Van Zyl et al.
11,282,677 B2 3/2022 Shaw et al.
11,284,500 B2 3/2022 Dorf et al.
11,437,221 B2 9/2022 Carter et al.
11,569,066 B2 1/2023 Cubaynes et al.
11,615,941 B2 3/2023 Brouk et al.
11,670,487 B1 * 6/2023 Nguyen .................. H03K 3/57 307/52
11,842,884 B2 12/2023 Shaw et al.
11,875,972 B2 1/2024 Driessen
11,887,812 B2 * 1/2024 Nguyen ........... H01J 37/32128
11,942,309 B2 * 3/2024 Singh ............... H01J 37/32706
11,978,611 B2 5/2024 Carter et al.
11,978,613 B2 5/2024 Nguyen
12,009,179 B2 6/2024 Nguyen
12,034,405 B2 7/2024 Yamamoto
12,046,448 B2 7/2024 Singh et al.
12,125,674 B2 * 10/2024 Carter .............. H01J 37/32137
12,142,452 B2 11/2024 Carter et al.
12,142,460 B2 11/2024 Shaw et al.
12,294,212 B2 * 5/2025 Alskran ............... H02M 1/346
2001/0014540 A1 8/2001 Shan et al.
2002/0038631 A1 4/2002 Sumiya et al.
2002/0115301 A1 8/2002 Savas
2002/0144786 A1 10/2002 Chiang et al.
2002/0150695 A1 10/2002 Kodama
2002/0185228 A1 12/2002 Chen et al.
2002/0189761 A1 12/2002 Hedberg et al.
2003/0033116 A1 2/2003 Brcka et al.
2003/0106647 A1 6/2003 Koshiishi et al.
2004/0007326 A1 1/2004 Roche et al.
2004/0094402 A1 5/2004 Gopalraja et al.
2004/0149218 A1 8/2004 Collins et al.
2004/0226657 A1 11/2004 Hoffman
2005/0090118 A1 4/2005 Shannon et al.
2005/0103275 A1 5/2005 Sasaki et al.
2005/0160985 A1 7/2005 Brcka
2005/0260354 A1 11/2005 Singh et al.
2005/0279457 A1 12/2005 Matsudo et al.
2006/0017388 A1 1/2006 Stevenson
2006/0066248 A1 3/2006 Chistyakov
2006/0088655 A1 4/2006 Collins et al.
2006/0130971 A1 6/2006 Chang et al.
2006/0171093 A1 8/2006 Ishimura et al.
2006/0221000 A1 10/2006 Moon
2006/0226786 A1 10/2006 Lin et al.
2006/0278518 A1 12/2006 Kouznetsov
2007/0035908 A1 2/2007 Kitsunai et al.
2007/0121267 A1 5/2007 Kotaníet al.
2007/0139112 A1 6/2007 Bocock et al.
2007/0139122 A1 6/2007 Nagarkatti et al.
2007/0186855 A1 8/2007 Dhindsa
2007/0186856 A1 8/2007 Yasui et al.
2007/0193975 A1 8/2007 Wilson
2007/0246163 A1 10/2007 Paterson et al.
2007/0251813 A1 11/2007 Ilic et al.
2008/0135400 A1 6/2008 Kadlec et al.
2009/0044750 A1 2/2009 Pipitone
2009/0077150 A1 3/2009 Wendt
2009/0078678 A1 3/2009 Kojima et al.
2009/0183117 A1 7/2009 Chang
2009/0183771 A1 7/2009 Sannomiya et al.
2009/0200494 A1 8/2009 Hatem et al.
2009/0255800 A1 10/2009 Koshimizu
2009/0298287 A1 12/2009 Shannon et al.
2010/0063787 A1 3/2010 Broka
2010/0072172 A1 3/2010 Ui et al.
2010/0126893 A1 5/2010 Sinykin
2010/0154994 A1 6/2010 Fischer et al.
2010/0161353 A1 6/2010 Mayaud
2010/0208409 A1 8/2010 Bluck et al.
2010/0244802 A1 9/2010 Alexander
2010/0248489 A1 9/2010 Koguchi et al.
2010/0276273 A1 11/2010 Heckman et al.
2010/0283395 A1 11/2010 Van Zyl et al.
2010/0296977 A1 11/2010 Hancock
2010/0332011 A1 12/2010 Venugopal et al.
2011/0031217 A1 2/2011 Himori
2011/0038187 A1 2/2011 Horishita et al.
2011/0065161 A1 3/2011 Kwasinski et al.
2011/0089023 A1 4/2011 Tanaka et al.
2011/0095689 A1 4/2011 Gilbert
2011/0097510 A1 4/2011 Makino et al.
2011/0220491 A1 9/2011 Hilliard
2011/0223750 A1 9/2011 Hayash et al.
2011/0226617 A1 9/2011 Hofmann et al.
2011/0248634 A1 10/2011 Hell et al.
2011/0253672 A1 10/2011 Kamibayashi et al.
2011/0259851 A1 10/2011 Brouk et al.
2011/0286580 A1 * 11/2011 Beland ..................... H05G 1/12 378/111
2011/0318933 A1 12/2011 Yatsuda et al.
2012/0000421 A1 1/2012 Miller et al.
2012/0052599 A1 3/2012 Brouk et al.
2012/0052689 A1 3/2012 Tokashiki
2012/0097524 A1 4/2012 Pipitone et al.
2012/0187844 A1 7/2012 Hoffman et al.
2012/0217221 A1 * 8/2012 Hoffman ................ C23C 16/50 216/61
2012/0235976 A1 9/2012 Van Lier
2012/0318456 A1 12/2012 Brouk et al.
2012/0319584 A1 12/2012 Brouk et al.
2013/0001196 A1 1/2013 Hoffman et al.
2013/0006555 A1 1/2013 Roberg et al.
2013/0083566 A1 4/2013 Gaknoki et al.
2013/0122711 A1 5/2013 Marakhtanov et al.
2013/0136872 A1 5/2013 Booth et al.
2013/0206338 A1 8/2013 Tanaka
2013/0320853 A1 12/2013 Carter et al.
2013/0327272 A1 * 12/2013 Augustyniak ..... H01J 37/32917 118/712
2014/0061156 A1 3/2014 Brouk et al.
2014/0062303 A1 3/2014 Hoffman et al.
2014/0062495 A1 * 3/2014 Carter ............... H01J 37/32944 324/459
2014/0117861 A1 5/2014 Finley et al.
2014/0117872 A1 5/2014 Finley
2014/0148016 A1 5/2014 Kanazawa et al.
2014/0173158 A1 6/2014 Valcore, Jr.
2014/0231389 A1 8/2014 Nagami et al.
2014/0263182 A1 9/2014 Chen et al.
2014/0265910 A1 9/2014 Kobayashi et al.
2014/0302682 A1 10/2014 Muto et al.
2014/0305905 A1 10/2014 Yamada et al.
2014/0317563 A1 10/2014 O'Byrne
2015/0076112 A1 3/2015 Sriraman et al.
2015/0126037 A1 5/2015 Chen et al.
2015/0144596 A1 5/2015 Brouk et al.
2015/0170886 A1 6/2015 Morimoto et al.
2015/0222181 A1 8/2015 Coleman
2015/0250046 A1 9/2015 Habu
2015/0270104 A1 9/2015 Van Zyl
2015/0279624 A1 10/2015 Toyota et al.
2015/0315698 A1 11/2015 Chistyakov
2015/0325413 A1 11/2015 Km et al.
2015/0348763 A1 12/2015 Mori et al.
2015/0371827 A1 12/2015 Godet et al.

(56) References Cited

U.S. PATENT DOCUMENTS

2016/0020072 A1 1/2016 Brouk et al.
2016/0020108 A1 1/2016 Ranjan et al.
2016/0027616 A1 1/2016 Ramaswamy et al.
2016/0053017 A1 2/2016 Orentas et al.
2016/0056017 A1 2/2016 Kim et al.
2016/0064247 A1 3/2016 Tomura et al.
2016/0079037 A1 3/2016 Hirano et al.
2016/0126068 A1 5/2016 Leo et al.
2016/0126069 A1 5/2016 Kwon et al.
2016/0240353 A1 8/2016 Nagami
2016/0351375 A1 12/2016 Valcore, Jr. et al.
2017/0018411 A1 1/2017 Sriraman et al.
2017/0029941 A1 2/2017 Allen et al.
2017/0053820 A1 2/2017 Bosch et al.
2017/0062190 A1 3/2017 Leo et al.
2017/0099723 A1 4/2017 Nagami et al.
2017/0154781 A1 6/2017 Ranjan et al.
2017/0256381 A1 9/2017 Denpoh
2017/0278665 A1 9/2017 Carter et al.
2017/0286389 A1 10/2017 Coneviva et al.
2017/0330731 A1 11/2017 Van Zyl
2017/0345620 A1 11/2017 Coumou et al.
2017/0358431 A1 12/2017 Dorf et al.
2018/0005802 A1 1/2018 Chen et al.
2018/0019100 A1 1/2018 Brouk et al.
2018/0047573 A1 2/2018 Tanaka et al.
2018/0082824 A1 3/2018 Likhanskii et al.
2018/0166249 A1 6/2018 Dorf et al.
2018/0226225 A1 8/2018 Koh et al.
2018/0233321 A1 8/2018 Caron
2018/0287484 A1* 10/2018 Braginsky ............... H02J 3/381
2018/0342903 A1 11/2018 Lou et al.
2018/0373885 A1 12/2018 Arad et al.
2019/0035606 A1* 1/2019 Yoo ................... H01J 37/32146
2019/0066979 A1 2/2019 Shoeb et al.
2019/0131110 A1 5/2019 Ziemba et al.
2019/0157040 A1* 5/2019 Fairbairn ................ C23C 14/48
2019/0157041 A1 5/2019 Zyl et al.
2019/0157042 A1 5/2019 Van Zyl et al.
2019/0157043 A1* 5/2019 Shaw ................ H01J 37/32174
2019/0172685 A1 6/2019 Van Zyl et al.
2019/0180982 A1* 6/2019 Brouk ............... H01J 37/32146
2019/0273496 A1 9/2019 van Zyl
2019/0316249 A1 10/2019 Abraham et al.
2020/0020510 A1 1/2020 Shoeb et al.
2020/0090905 A1 3/2020 Brouk et al.
2020/0111644 A1 4/2020 Long et al.
2020/0135527 A1 4/2020 Sung et al.
2020/0203128 A1 6/2020 Fairbairn et al.
2020/0266036 A1* 8/2020 Aoki ................. H01J 37/32146
2020/0294642 A1 9/2020 Bostic et al.
2020/0313567 A1* 10/2020 Porter, Jr. ........... H02M 3/1584
2020/0357607 A1 11/2020 Ziemba et al.
2020/0357658 A1* 11/2020 Nagami ............ H01J 37/32568
2021/0005428 A1 1/2021 Shaw et al.
2021/0013006 A1 1/2021 Nguyen et al.
2021/0035225 A1 2/2021 Simpson et al.
2021/0042516 A1 2/2021 Panakkal
2021/0074513 A1 3/2021 Van Zyl et al.
2021/0091767 A1 3/2021 Cairoli et al.
2021/0118649 A1 4/2021 Huh et al.
2021/0134562 A1 5/2021 Fairbair et al.
2021/0202209 A1 7/2021 Van Zyl et al.
2021/0241996 A1 8/2021 Carter et al.
2021/0327679 A1 10/2021 Carter et al.
2021/0335579 A1 10/2021 Jang
2021/0351007 A1* 11/2021 Carter ...................... H03K 3/64
2022/0013330 A1 1/2022 Driessen et al.
2022/0037121 A1 2/2022 Dorf et al.
2022/0037122 A1 2/2022 Bowman et al.
2022/0070984 A1 3/2022 Van et al.
2022/0116033 A1 4/2022 Miller et al.
2022/0157555 A1 5/2022 Carter et al.
2022/0223377 A1 7/2022 Driessen et al.
2022/0254610 A1* 8/2022 Bhutta ..................... H03H 7/38
2022/0270856 A1 8/2022 Poulose et al.
2022/0285131 A1 9/2022 Shaw et al.
2022/0384149 A1 12/2022 Shi et al.
2022/0393589 A1* 12/2022 Maksimovic ........... H02M 1/08
2022/0415615 A1 12/2022 Cubaynes et al.
2023/0050119 A1 2/2023 Martinez et al.
2023/0050841 A1 2/2023 Nguyen
2023/0064671 A1* 3/2023 Alskran .............. H02M 7/5387
2023/0116058 A1 4/2023 Carter et al.
2023/0207264 A1 6/2023 Hasegawa
2023/0238216 A1 7/2023 Singh et al.
2023/0253183 A1* 8/2023 Mavretic ............ H10D 62/8503 333/32
2023/0253187 A1* 8/2023 Singh ................ H01J 37/32284 361/240
2023/0268162 A1 8/2023 Van Zyl et al.
2023/0343556 A1 10/2023 Nguyen
2023/0369016 A1 11/2023 Carter et al.
2023/0377839 A1 11/2023 Carter et al.
2023/0377840 A1 11/2023 Carter et al.
2023/0395354 A1 12/2023 Shaw et al.
2023/0395355 A1 12/2023 Shaw et al.
2024/0030001 A1 1/2024 Nguyen et al.
2024/0055225 A1 2/2024 Brouk et al.
2024/0055227 A1 2/2024 Ziemba et al.
2024/0071721 A1 2/2024 Brouk et al.
2024/0079210 A1 3/2024 Nguyen
2024/0154404 A1* 5/2024 Alskran .................... H02J 1/06
2024/0194452 A1* 6/2024 Singh ................ H01L 21/67069
2024/0242945 A1* 7/2024 Nguyen ............ H01J 37/32146
2024/0282553 A1 8/2024 Zhang
2024/0304419 A1 9/2024 Nguyen
2024/0348225 A1 10/2024 Suh et al.
2024/0355585 A1 10/2024 Burry et al.
2024/0404788 A1 12/2024 Luu et al.
2025/0166965 A1 5/2025 Carter
2025/0174436 A1 5/2025 Radomski et al.
2025/0253133 A1 8/2025 Ziemba et al.
2025/0259822 A1 8/2025 Ziemba et al.

FOREIGN PATENT DOCUMENTS

CN 101685772 A 3/2010
CN 201465987 U 6/2010
CN 101835334 A 9/2010
CN 101978461 A 2/2011
CN 101990353 A 3/2011
CN 102217045 A 10/2011
CN 102405512 A 4/2012
CN 105097404 A 11/2015
CN 206272512 U 6/2017
CN 106920729 A 7/2017
CN 111788655 A 10/2020
CN 114222958 A 3/2022
DE 19912981 C1 12/2000
EP 0 383 570 A2 8/1990
EP 1 978 542 A1 10/2008
EP 1 129 481 B1 2/2012
GB 2 382 459 A 5/2003
GB 2 400 613 A 10/2004
JP 60-126832 A 7/1985
JP S62-125626 A 6/1987
JP 02141572 A 5/1990
JP H2-141572 A 5/1990
JP H4-193329 A 7/1992
JP H6-243992 A 9/1994
JP H9-293600 A 11/1997
JP H1-1087097 A 3/1999
JP H11298303 A 10/1999
JP 2001-237234 A 8/2001
JP 2001-525601 A 12/2001
JP 2002-050611 A 2/2002
JP 2003-133404 A 5/2003
JP 2004-085446 A 3/2004
JP 2004-193564 A 7/2004
JP 2005-527078 A 9/2005
JP 2005-534187 A 11/2005
JP 2006-147269 A 6/2006
JP 2006-286254 A 10/2006

(56) References Cited

FOREIGN PATENT DOCUMENTS

| | | | |
|---|---|---|---|
| JP | 2007-311182 | A | 11/2007 |
| JP | 2007-336148 | A | 12/2007 |
| JP | 4016325 | B2 | 12/2007 |
| JP | 2008-501224 | A | 1/2008 |
| JP | 2008-157906 | A | 7/2008 |
| JP | 2009-071133 | A | 4/2009 |
| JP | 2009-514176 | A | 4/2009 |
| JP | 2009-540569 | A | 11/2009 |
| JP | 2010-103465 | A | 5/2010 |
| JP | 2010-219026 | A | 9/2010 |
| JP | 2010-238960 | A | 10/2010 |
| JP | 2011-519115 | A | 6/2011 |
| JP | 2011-222292 | A | 11/2011 |
| JP | 2012079886 | A | 4/2012 |
| JP | 2012-104382 | A | 5/2012 |
| JP | 2015-115564 | A | 6/2015 |
| JP | 2015-534212 | A | 11/2015 |
| JP | 2015-534718 | A | 12/2015 |
| JP | 2016-500132 | A | 1/2016 |
| JP | 2017055100 | A | 3/2017 |
| JP | 6141478 | B2 | 6/2017 |
| JP | 6203476 | B2 | 9/2017 |
| JP | 2018195588 | A | 12/2018 |
| JP | 2019-523993 | A | 8/2019 |
| JP | 2019197892 | A | 11/2019 |
| JP | 2021-503700 | A | 2/2021 |
| JP | 2021-503701 | A | 2/2021 |
| JP | 2021-503702 | A | 2/2021 |
| JP | 2022-541004 | A | 9/2022 |
| JP | 7736714 | B2 | 9/2025 |
| KR | 1020110016486 | A | 2/2011 |
| KR | 10-2012-0019428 | A | 3/2012 |
| KR | 10-1800623 | B1 | 11/2017 |
| TW | 514967 | B | 12/2002 |
| TW | 200610451 | A | 3/2006 |
| TW | 200811905 | A | 3/2008 |
| TW | 200915375 | A | 4/2009 |
| TW | 200952560 | A | 12/2009 |
| TW | 201009879 | A | 3/2010 |
| TW | 201116166 | A | 5/2011 |
| TW | 201142068 | A | 12/2011 |
| TW | 201243812 | A | 11/2012 |
| TW | 201415522 | A | 4/2014 |
| TW | 201614097 | A | 4/2016 |
| TW | 201621974 | A | 6/2016 |
| TW | 201637069 | A | 10/2016 |
| WO | 91/09150 | A1 | 6/1991 |
| WO | 95/07544 | A1 | 3/1995 |
| WO | 97/49267 | A1 | 12/1997 |
| WO | 02/15222 | A2 | 2/2002 |
| WO | 02/19395 | A1 | 3/2002 |
| WO | 2004/012220 | A2 | 2/2004 |
| WO | 2004/114461 | A2 | 12/2004 |
| WO | 2010/008006 | A1 | 1/2010 |
| WO | 2010/013476 | A1 | 2/2010 |
| WO | 2010/080421 | A2 | 7/2010 |
| WO | 2010126893 | A2 | 11/2010 |
| WO | 2012/007483 | A1 | 1/2012 |
| WO | 2012/030500 | A1 | 3/2012 |
| WO | 2012103101 | A1 | 8/2012 |
| WO | 2013/016619 | A1 | 1/2013 |
| WO | 2014/035889 | A1 | 3/2014 |
| WO | 2014/035897 | A1 | 3/2014 |
| WO | 2017/126184 | A1 | 7/2017 |
| WO | 2021/064110 | A1 | 4/2021 |
| WO | 2021/231035 | A1 | 11/2021 |
| WO | 2022/013017 | A1 | 1/2022 |
| WO | 2022/013018 | A1 | 1/2022 |

OTHER PUBLICATIONS

Honda, S., et al., "Hydrogenation of Polycrystalline Silicon Thin Films", Thin Solid Films, vol. 501, Oct. 5, 2005, pp. 144-148.

International Preliminary Report on Patentability Chapter I received for International PCT Application Serial No. PCT/US2020/041771 dated Jan. 27, 2022, 10 pages.

International Preliminary Report on Patentability received for International PCT Application Serial No. PCT/US2010/032582 dated Nov. 10, 2011, 8 pages.

International Preliminary Report on Patentability received for International PCT Application Serial No. PCT/US2011/047467 dated Mar. 14, 2013, 7 pages.

International Preliminary Report on Patentability received for International PCT Application Serial No. PCT/US2012/020219 dated Jul. 18, 2013, 7 pages.

International Preliminary Report on Patentability received for International PCT Application Serial No. PCT/US2012/048504 dated Feb. 6, 2014, 11 pages.

International Preliminary Report on Patentability received for International PCT Application Serial No. PCT/US2013/056634 dated Mar. 12, 2015, 7 pages.

International Preliminary Report on Patentability received for International PCT Application Serial No. PCT/US2013/056647 dated Mar. 12, 2015, 7 pages.

International Preliminary Report on Patentability received for International PCT Application Serial No. PCT/US2013/056657 dated Mar. 12, 2015, 8 pages.

International Preliminary Report on Patentability received for International PCT Application Serial No. PCT/US2013/056659 dated Mar. 12, 2015, 8 pages.

International Preliminary Report on Patentability received for International PCT Application Serial No. PCT/US2013/056851 dated Mar. 12, 2015, 8 pages.

International Preliminary Report On Patentability Received for International PCT Application Serial No. PCT/US2018/061653 dated May 28, 2020, 9 pages.

International Preliminary Report on Patentability received for International PCT Application Serial No. PCT/US2018/061671 dated May 28, 2020, 14 pages.

International Preliminary Report on Patentability received International Application Serial No. PCT/US2018/061675 dated May 28, 2020, 9 pages.

International Search Report and Writen Opinion received for International PCT Application Serial No. PCT/US2012/048504 dated Sep. 17, 2012, 13 pages.

International Search Report And Written Opinion received for International Application Serial No. PCT/US2020/027927 dated Sep. 17, 2021, 14 pages.

International Search Report and Written Opinion received for International PCT Application Serial No. PCT/US2010/032582 dated Feb. 21, 2011, 10 pages.

International Search Report and Written Opinion received for International PCT Application Serial No. PCT/US2011/047467 dated Nov. 24, 2011, 9 pages.

International Search Report and Written Opinion received for International PCT Application Serial No. PCT/US2012/022380 dated Mar. 14, 2012, 11 pages.

International Search Report and Written Opinion received for International PCT Application Serial No. PCT/US2012/029953 dated May 28, 2012, 11 pages.

International Search Report and Written Opinion received for International PCT Application Serial No. PCT/US2012/20219 dated Feb. 22, 2012, 10 pages.

International Search Report and Written Opinion received for International PCT Application Serial No. PCT/US2013/056634 dated Nov. 15, 2013, 10 pages.

International Search Report and Written Opinion received for International PCT Application Serial No. PCT/US2013/056647 dated Oct. 30, 2013, 10 pages.

International Search Report and Written Opinion received for International PCT Application Serial No. PCT/US2013/056657 dated Oct. 28, 2013, 11 pages.

International Search Report and Written Opinion received for International PCT Application Serial No. PCT/US2013/056659 dated Nov. 8, 2013, 11 pages.

(56) References Cited

OTHER PUBLICATIONS

International Search Report and Written Opinion received for International PCT Application Serial No. PCT/US2013/056851 dated Nov. 18, 2013, 11 pages.
International Search Report and Written Opinion received for International PCT Application Serial No. PCT/US2018/061575 dated Mar. 6, 2019, 12 pages.
International Search Report and Written Opinion received for International PCT Application Serial No. PCT/US2018/061653 dated Mar. 8, 2019, 10 pages.
International Search Report and Written Opinion received for International PCT Application Serial No. PCT/US2018/061671 dated Mar. 13, 2019, 17 pages.
International Search Report and Written Opinion received for International PCT Application Serial No. PCT/US2021/027927 dated Sep. 17, 2021, 9 pages.
International Search Report and Written Opinion received for International PCT Application Serial No. PCT/US2022/014888 dated Mar. 25, 2022, 18 pages.
International Search Report and Written Opinion received for International PCT Application Serial No. PCT/US2022/016278 dated May 17, 2022, 10 pages.
International Search Report and Written Opinion received for International PCT Application Serial No. PCT/US2022/016279 dated Jun. 9, 2022, 8 pages.
International Search Report and Written Opinion received for International PCT Application Serial No. PCT/US2022/040046 dated Oct. 27, 2022, 9 pages.
Jeon, M., et al., "Hydrogenated Amorphous Silicon Film as Intrinsic Passivation Layer Deposited at Various Temperatures using RF remote-PECVD technique", Current Applied Physics, vol. 10, No. 2010, Nov. 12, 2009, pp. S237-S240.
Kim, J.Y., et al., "Remote Plasma Enhanced Atomic Layer Deposition ofTiN Thin Films Using Metalorganic Precursor", J. Vac. Sci. Technol. A, vol. 22, No. 1, Jan./Feb. 2004, Nov. 13, 2003, pp. 8-12.
Krolak, M, "Matthew Krolak's MyElectricEngine.Com Megnetoplasmadynamic (MPD) Thruster Design", Webpage downloaded from http://myelectricengine.com/projects/mpdthruster/mpdthruster.html, Apr. 28, 2011, 7 pages.
Kuo, M.S., et al., "Influence of C4F8/Ar-based etching and H2-based remote plasma ashing processes on ultralow Materials Modifications", J. Vac. Sci. Technol. B, vol. 28, No. 2, Mar./Apr. 2010, Mar. 19, 2010, pp. 284-294.
Non Final Office Action received for U.S. Appl. No. 12/767,775 dated Apr. 25, 2013, 28 pages.
Non Final Office Action received for U.S. Appl. No. 12/767,775 dated Jul. 1, 2014, 48 pages.
Non Final Office Action received for U.S. Appl. No. 12/767,775 dated Jun. 17, 2015, 28 pages.
Non Final Office Action received for U.S. Appl. No. 12/767,775 dated Oct. 17, 2012, 33 pages.
Non Final Office Action received for U.S. Appl. No. 12/870,837 dated Apr. 9, 2015, 40 pages.
Non Final Office Action received for U.S. Appl. No. 12/870,837 dated Mar. 22, 2013, 46 pages.
Non Final Office Action received for U.S. Appl. No. 13/193,299 dated Dec. 18, 2013, 43 pages.
Non Final Office Action received for U.S. Appl. No. 13/193,299 dated May 21, 2015, 24 pages.
Non Final Office Action received for U.S. Appl. No. 13/193,345 dated Apr. 16, 2015, 34 pages.
Non Final Office Action received for U.S. Appl. No. 13/193,345 dated Nov. 7, 2013, 36 pages.
Non Final Office Action received for U.S. Appl. No. 13/343,576 dated Nov. 13, 2014, 24 pages.
Final Office Action received for U.S. Appl. No. 18/198,788 dated Aug. 12, 2024, 11 pages.
Final Office Action received for U.S. Appl. No. 16/557,209 dated Jul. 10, 2024, 46 pages.
Final Office Action received for U.S. Appl. No. 17/902,987 dated Jun. 12, 2024, 17 pages.
Notice of Allowance received for U.S. Appl. No. 17/902,987 dated Jul. 24, 2024, 13 pages.
Communication pursuant to Article 94(3) EPC received for European Patent Application Serial No. 18878531.5 dated Apr. 18, 2024, 6 pages.
Notice of Ground of Rejection received for Korean Patent Application Serial No. 10-2020-7017361 dated Mar. 27, 2024, 22 pages.
Notice of Final Rejection received for Japanese Patent Application Serial No. 2020-545048 dated Jun. 13, 2024, 6 pages.
Notice of Allowance received for U.S. Appl. No. 16/871,613 dated Jun. 20, 2024, 14 pages.
Notice of Allowance received for U.S. Appl. No. 16/871,613 dated Jul. 25, 2024, 6 pages.
Notice of Allowance received for U.S. Appl. No. 16/871,613 dated Aug. 21, 2024, 6 pages.
Office Action received for Taiwan Patent Application Serial No. 109123604 dated Jun. 24, 2024, 26 pages.
Extended European Search Report received for European Patent Application Serial No. 21803110.2 dated Jun. 6, 2024, 11 pages.
Notice of Reason of Rejection received for Japanese Patent Application Serial No. 2022-501232 dated May 29, 2024, 10 pages.
Notice of Allowance received for U.S. Appl. No. 18/450,635 dated Jul. 29, 2024, 45 pages.
International Preliminary Report On Patentability received for International PCT Application Serial No. PCT/US2022/053703 dated Aug. 8, 2024, 7 pages.
International Preliminary Report On Patentability received for International PCT Application Serial No. PCT/US2022/053706 dated Aug. 8, 2024, 8 pages.
International Preliminary Report On Patentability received for International PCT Application Serial No. PCT/US2022/053709 dated Aug. 8, 2024, 7 pages.
Extended European Search Report received for European Patent Application Serial No. 24170540.9 dated Jul. 23, 2024, 9 pages.
Corrected Notice of Allowability received for U.S. Appl. No. 18/450,635 dated Oct. 9, 2024, 6 pages.
International Preliminary Report on Patentability for International PCT Application No. PCT/US2022/053703 dated Aug. 8, 2024, 7 pages.
International Preliminary Report on Patentability for International PCT Application No. PCT/US2022/053706 dated Aug. 8, 2024, 8 pages.
International Preliminary Report on Patentability for International PCT Application No. PCT/US2022/053709 dated Aug. 8, 2024, 7 pages.
International Search Report and Written Opinion for International Application No. PCT/US2024/035494 dated Sep. 19, 2024, 14 pages.
Requirement for Restriction received for U.S. Appl. No. 17/401,422 dated Nov. 13, 2024, 5 pages.
Final Office Action received for U.S. Appl. No. 18/318,861 dated Nov. 12, 2024, 10 pages.
Notice of Allowance received for U.S. Appl. No. 17/181,382 dated Oct. 23, 2014, 8 pages.
Notice of Reasons for Rejection received for Japanese Patent Application Serial No. 2022568414 dated Oct. 10, 2024, 10 pages.
Non-Final Office Action received for U.S. Appl. No. 17/245,825 dated Sep. 10, 2024, 27 pages.
Advisory Action received for U.S. Appl. No. 18/198,788 dated Aug. 30, 2024, 3 pages.
Non-Final Office Action received for U.S. Appl. No. 18/198,788 dated Nov. 8, 2024, 11 pages.
Notice of Allowance received for U.S. Appl. No. 18/330,005 dated Sep. 18, 2024, 9 pages.
Non-Final Office Action received for U.S. Appl. No. 18/495,452 dated Sep. 23, 2024, 50 pages.
Lessons in Electric Circuits vol. III—Semiconductors (Years: 2009).
Corrected Notice of Allowability received for U.S. Appl. No. 17/902,987 dated Sep. 26, 2024, 5 pages.
Corrected Notice of Allowability received for U.S. Appl. No. 17/902,987 dated Sep. 30, 2024, 5 pages.

(56) References Cited

OTHER PUBLICATIONS

Non-Final Office Action received for U.S. Appl. No. 17/678,604 dated Sep. 23, 2024, 8 pages.
Final Office Action received for U.S. Appl. No. 18/450,652 dated Sep. 18, 2024, 6 pages.
Notice of Allowance received for U.S. Appl. No. 18/450,652 dated Oct. 23, 2024, 9 pages.
Qihao Yu, Erik Lemmen, Korneel Wijnands, Bas Vermulst, A Switched-Mode Power Amplifier For Ion Energy Control In Plasma Etching, Article, Jan. 9, 2020, Institute of Electrical and Electronics Engineers.
Qihao Yu, Erik Lemmen, Korneel Wijnands, Bas Vermulst, Accurate Ion Energy Control in Plasma Processing by Switched-Mode Power Converter, article, Jan. 7, 2022, Institute of Electrical and electronics Engineers.
Tahsin Faraz, Yuri G. P. Verstappen, Marcel A. Verheijen, Nicholas J. Chittock, Javier Escandon Lopez, Erik Heijdra, Wouter J. H. van Gennip, Wilhelmus M. M. Kessels, and Adriaan J. M. Mackus, Precise Ion energy Control with Tailored Waveform Biasing for Atomic Scale Processing, Dec. 7, 2020 Article, AIP Publishing.
Ford, Nathan K, Office Action issued in U.S. Appl. No. 17/401,422, filed Apr. 24, 2025, 100 pages.
PCT, International Search Report and Written Opinion issued in PCT/US2025/017119, Apr. 29, 2025, 20 pages.
Extended European Search Report received for European Patent Application Serial No. 18877737.9 dated Aug. 25, 2021, 165 pages.
Extended European Search Report received for European Patent Application Serial No. 10770205.2 dated Jan. 30, 2013, 8 pages.
Extended European Search Report received for European Patent Application Serial No. 18877322.0 Sep. 14, 2021. 129 pages.
Extended European Search Report received for European Patent Application Serial No. 18878531.5 dated Sep. 1, 2021, 126 pages.
Final Office Action received for U.S. Appl. No. 17/150,633 dated Jul. 27, 2022, 48 pages.
Final Office Action received for U.S. Appl. No. 12/767,775 dated Dec. 15, 2014, 37 pages.
Final Office Action received for U.S. Appl. No. 12/767,775 dated Sep. 10, 2013, 30 pages.
Final Office Action received for U.S. Appl. No. 12/870,837 dated Dec. 20, 2013, 33 pages.
Final Office Action received for U.S. Appl. No. 13/193,299 dated Dec. 4, 2015, 30 pages.
Final Office Action received for U.S. Appl. No. 13/193,299 dated Sep. 26, 2014, 37 pages.
Final Office Action received for U.S. Appl. No. 13/193,345 dated Jan. 15, 2016, 33 pages.
Final Office Action received for U.S. Appl. No. 13/193,345 dated Jul. 7, 2014, 26 pages.
Final Office Action received for U.S. Appl. No. 13/596,976 dated Apr. 5, 2017, 23 pages.
Final Office Action received for U.S. Appl. No. 13/596,976 dated Jul. 1, 2016, 34 pages.
Final Office Action received for U.S. Appl. No. 13/597,032 dated Apr. 9, 2015, 32 pages.
Final Office Action received for U.S. Appl. No. 13/597,050 dated Mar. 10, 2016, 19 pages.
Final Office Action received for U.S. Appl. No. 13/597,093 dated Jul. 8, 2016, 25 pages.
Final Office Action received for U.S. Appl. No. 14/803,815 dated Mar. 12, 2019, 15 pages.
Final Office Action received for U.S. Appl. No. 15/495,513 dated Apr. 14, 2021, 20 pages.
Final Office Action received for U.S. Appl. No. 16/278,822 dated Feb. 15, 2022, 52 pages.
First Office Action received for Chinese Patent Application Serial No. 201080003206.X dated Sep. 4, 2013, 15 pages.
First Office Action received for Chinese Patent Application Serial No. 201180046783.1 dated Mar. 24, 2015, 18 pages.
First Office Action received for Chinese Patent Application Serial No. 201280047162.X dated Sep. 6, 2015, 18 pages.
First Office Action received for Chinese Patent Application Serial No. 20171074712.5 dated Feb. 22, 2019, 9 pages.
First Office Action received for Chinese Patent Application Serial No. 201711336133.6 dated Mar. 4, 2019, 16 pages.
Fourth Office Action received for Chinese Patent Application Serial No. 201080003206.X dated Jun. 10, 2015. 8 pages.
Fourth Office Action received for Chinese Patent Application Serial No. 201710704712.5 dated Apr. 1, 2020, 7 pages.
Gangoli, S.P., et al., "Production and transport chemistry of atomic fluorine in remote plasma source and cylindrical reaction chamber", J. Phys. D: Appl. Phys., vol. 40, Aug. 16, 2007, pp. 5140-5154.
George, M.A., et al., "Silicon Nitride Arc Thin Films by New Plasma Enhanced Chemical Vapor Deposition SourceTechnology", Article downloaded from www.generalplasma.com, Jul. 7, 2011, pp. 1-5.
Giangregorio, M.M., et al., "Role of Plasma Activation in Tailoring the Nanostructure of Multifunctional Oxides Thin3 Films", Applied Surface Sci., vol. 255, Sep. 10, 2008, pp. 6396-5400.
Ferdous, Zannatul, Office action issued in U.S. Appl. No. 18/350,516, filed Mar. 20, 2025, 133 pages.
KIPO, Notice of Grounds for Rejection issued in Korean Patent Application No. 10-2022-7004812, Mar. 12, 2025, 15 pages.
PCT, International Preliminary Report on Patentability issued in PCT/US2023/073153, Mar. 13, 2025, 9 pages.
PCT, International Search Report and Written Opinion issued in PCT/US2024/055362, Jan. 14, 2025, 18 pages.
Yu, Yuechuan, Office Action issued in U.S. Appl. No. 18/318,861, filed Feb. 20, 2025, 102 pages.
Lee, Jye-June, Office Action issued in U.S. Appl. No. 18/742,088, filed Jan. 16, 2025, 36 pages.
Notice of Allowance received for U.S. Appl. No. 16/194,125 dated Jun. 18, 2020, 42 pages.
Notice of Allowance received for U.S. Appl. No. 16/246,996 dated Jun. 18, 2020, 27 pages.
Notice of Allowance received for U.S. Appl. No. 16/270,391 dated Jun. 16, 2020, 36 pages.
Notice of Allowance received for U.S. Appl. No. 16/278,822 dated Dec. 1, 2022, 13 pages.
Notice of Allowance received for U.S. Appl. No. 16/803,020 dated Sep. 14, 2020, 100 pages.
Notice of Allowance received for U.S. Appl. No. 16/896,709 dated Nov. 17, 2021, 46 pages.
Notice of Allowance received for U.S. Appl. No. 17/031,027 dated Feb. 3, 2022, 8 pages.
Notice of Allowance received for U.S. Appl. No. 17/031,027 dated Oct. 20, 2021, 81 pages.
Notice of Allowance received for U.S. Appl. No. 17/150,633 dated Nov. 15, 2022, 42 pages.
Notice of Allowance received for U.S. Appl. No. 17/171,164 dated Jun. 8, 2022, 13 pages.
Notice of Allowance received for U.S. Appl. No. 17/171,164 dated May 4, 2022, 38 pages.
Notice of Allowance received for U.S. Appl. No. 17/584,921 dated Nov. 16, 2022, 9 pages.
Notice of Final Rejection received for Japanese Patent Application Serial No. 2013547731 dated Jul. 28, 2015, 13 pages.
Notice Of Grounds For Rejection received for Korean Patent Application Serial No. 1020157007771 dated May 31, 2018, 4 pages.
Notice Of Grounds For Rejection received for Korean Patent Application Serial No. 1020177033224 dated Aug. 6, 2018, 7 pages.
Notice Of Grounds For Rejection received for Korean Patent Application Serial No. 1020187029468 dated Feb. 7, 2019, 6 pages.
Notice of Reasons for Rejection received for Japanese Patent Application Serial No. 2013547731 dated Sep. 30, 2014, 8 pages.
Notice of Reasons for Rejection received for Japanese Patent Application Serial No. 2017091857 dated Feb. 2, 2018, 10 pages.
Notice of Reasons for Rejection received for Japanese Patent Application Serial No. 2020081092 dated Apr. 1, 2021, 6 pages.
Notice of Reasons for Rejection received for Japanese Patent Application Serial No. 2020545048 dated Aug. 19, 2022, 12 pages.
Office Action received for Chinese Patent Application Serial No. 201180046783.1 dated Dec. 7, 2016, 9 pages.

(56) References Cited

OTHER PUBLICATIONS

Office Action received for Chinese Patent Application Serial No. 201180046783.1 dated Dec. 8, 2015, 9 pages.
Office Action received for Chinese Patent Application Serial No. 201180046783.1 dated May 17, 2016, 8 pages.
Office Action received for Chinese Patent Application Serial No. 201280047162.X dated Apr. 26, 2016, 7 pages.
Office Action received for Chinese Patent Application Serial No. 201280047162.X dated Oct. 24, 2016, 31 pages.
Office Action received for Chinese Patent Application Serial No. 201380056068.5 dated Jun. 12, 2017, 16 pages.
Office Action received for Chinese Patent Application Serial No. 201380056068.5 dated Oct. 17, 2016, 15 pages.
Office Action received for Chinese Patent Application Serial No. 201380056070.2 dated Apr. 2, 2018, 6 pages.
Office Action received for Chinese Patent Application Serial No. 201380056070.2 dated Aug. 15, 2016, 25 pages.
Office Action received for Chinese Patent Application Serial No. 201380056070.2 dated Jul. 11, 2017, 13 pages.
Office Action received for European Patent Application Serial No. 10770205.2 dated Nov. 2, 2017, 30 pages.
Office Action received for European Patent Application Serial No. 10770205.2 dated Oct. 22, 2019, 6 pages.
Office Action received for European Patent Application Serial No. 11822326.2 dated Apr. 3, 2017, 4 pages.
Office Action received for European Patent Application Serial No. 11822326.2 dated Feb. 27, 2018, 5 pages.
Office Action received for European Patent Application Serial No. 11822326.2 dated Oct. 18, 2018, 6 pages.
Office Action received for Japanese Patent Application Serial No. 2012508593 dated Apr. 19, 2013, 11 pages.
Office Action received for Japanese Patent Application Serial No. 2013527088 dated Apr. 21, 2015, 10 pages.
Office Action received for Japanese Patent Application Serial No. 2014523057 dated Apr. 21, 2015, 11 pages.
Office Action received for Japanese Patent Application Serial No. 2015529905 dated Aug. 22, 2017, 16 pages.
Office Action received for Japanese Patent Application Serial No. 2015529905 dated Aug. 24, 2017, 14 pages.
Office Action received for Japanese Patent Application Serial No. 2015529906 dated May 16, 2017, 13 pages.
Office Action received for Japanese Patent Application Serial No. 2015529939 dated Sep. 19, 2017, 19 pages.
Office Action received for Japanese Patent Application Serial No. 2016-043215 dated Jan. 25, 2017, 7 pages.
Office Action received for Japanese Patent Application Serial No. 2018081644 dated Apr. 16, 2019, 21 pages.
Office Action received for Japanese Patent Application Serial No. 2018138425 dated Mar. 24, 2020, 7 pages.
Office Action received for Japanese Patent Application Serial No. 2018138425 dated May 22, 2019, 10 pages.
Office Action received for Japanese Patent Application Serial No. 20205545044 dated Aug. 25, 2022, 6 pages.
Office Action received for Korean Patent Application Serial No. 1020117009075 dated Mar. 25, 2013, 2 pages.
Office Action received for Korean Patent Application Serial No. 1020137007594 dated Jul. 28, 2014, 2 pages.
Office Action received for Korean Patent Application Serial No. 1020137019332 dated May 29, 2015, 18 pages.
Bruno, G., et al., "Real Time Ellipsometry for Monitoring Plasma-Assisted Epitaxial Growth of GaN", Applied Surface Sci., vol. 253, 2006, pp. 219-223.
Bruno, James, "Use of Simulation for Examining the Effects of Guessing Upon Knowledge Assessment on Standardized Tests", "Conference Proceedings of the 10th Conference on Winter Simulation, Miami, FL", 1978, vol. 2, pp. 759-765.
Bryns, B., et al . . . , "A VHF Driven Coaxial Atmospheric Air Plasma: Electrical and Optical Characterization", Dep't of Nuclear Engr., 2011, pp. 1-18.
Buzzi, F.L., et al., "Energy Distribution of Bombarding Ions in Plasma Etching of Dielectrics", "AVS 54th International Symposium", Oct. 15, 2007, 18 pages.
Communication pursuant to Article 94(3) EPC received for European Patent Application Serial No. 10770205.2 dated Jun. 8, 2021, 6 pages.
Communication Pursuant To Article 94(3) EPC received for European Patent Application Serial No. 10770205.2 dated Oct. 23, 2020, 4 pages.
Decision Of Rejection received for Chinese Patent Application Serial No. 201710704712.5 dated Aug. 10, 2020, 8 pages.
Decision of Rejection received for Korean Patent Application Serial No. 1020137019332 dated Jan. 20, 2016, 6 pages.
Emsellem, G., "Electrodeless Plasma Thruster Design Characteristics", 41st Joint Propulsion Conference, Jul. 11, 2005, 22 pages.
European Search Report received for European Patent Application Serial No. EP11822326 dated Oct. 9, 2015, 3 pages.
Japan Patent Office, Notice of Reasons for Rejection issued in JP Application No. 2022-568414, Oct. 10, 2024.
PCT, International Search Report and Written Opinion issued PCT/US2023/073153, Feb. 9, 2024, 18 pages.
Skibinski, Tomi Sweet, Non-final Office Action issued in U.S. Appl. No. 18/656,543, filed Nov. 15, 2024, 21 pages.
Yu, Yuechuan, Final Office Action issued in U.S. Appl. No. 18/318,861, filed Nov. 12, 2024, 95 pages.
Ciccarello et al., "ASHP Guidelines on the Pharmacy and Therapeutics Committee and the Formulary System", American Journal of Health-System Pharmacy, vol. 78, No. 10, May 15, 2021, pp. 907-915.
Examination report for European Patent Application Serial No. 18877737.9 dated Jun. 13, 2023, 5 pages.
Extended European search report received for European Patent Application Serial No. 23209856.6 dated Feb. 15, 2024, 9 pages.
Extended Search Report received for European Patent Application Serial No. 23173938.4 dated Jul. 20, 2023, 7 pages.
Final Office Action received for U.S. Appl. No. 16/577,209 dated Feb. 1, 2023, 80 pages.
First Office Action received for Chinese Patent Application Serial No. 201880086817.1 dated Dec. 9, 2022, 25 pages.
First Office Action received for Chinese Patent Application Serial No. 202080057686 dated Feb. 28, 2023, 17 pages.
International Preliminary Report On Patentability received for International Application Serial No. PCT/US2022/04888 mailed on Aug. 24, 2023, 8 pages.
International Preliminary Report On Patentability received for International PCT Application Serial No. PCT/US2022/016279 dated Aug. 31, 2023, 6 pages.
International Search Report and Written Opinion received for International PCT Application Serial No. PCT/US2022/053703, Apr. 6, 2023, 10 Pages.
International Search Report and Written Opinion received for International PCT Application Serial No. PCT/US2022/053706 dated Apr. 3, 2023, 14 pages.
International Search Report and Written Opinion received for International PCT Application Serial No. PCT/US2022/053709 dated Apr. 4, 2023, 10 pages.
Non Final Office Action received for U.S. Appl. No. 16/557,209 dated Nov. 21, 2023, 91 pages.
Non Final Office Action received for U.S. Appl. No. 16/871,613 dated Nov. 3, 2023, 146 pages.
Non Final Office Action received for U.S. Appl. No. 17/692,880 dated Mar. 31, 2023, 122 pages.
Non Final Office Action received for U.S. Appl. No. 17/902,987 dated Nov. 15, 2023, 121 pages.
Non Final Office Action received for U.S. Appl. No. 18/198,788 dated Dec. 12, 2023, 22 pages.
Non Final Office Action received for U.S. Appl. No. 18/330,005 dated Mar. 1, 2024, 18 pages.
Non Final Office Action received for U.S. Appl. No. 18/330,005 dated Nov. 14, 2023, 23 pages.
Werble, Cole "Formularies, Health Policy Brief Series 11", Prescription Drug Pricing, Sep. 14, 2017, 4 pages.

(56) References Cited

OTHER PUBLICATIONS

Non-Final Rejection office action received for U.S. Appl. No. 18/318,861 dated Mar. 20, 2024, 50 pages.
Notice of Allowance received for U.S. Appl. No. 16/926,876 dated Feb. 17, 2023, 47 pages.
Notice of Allowance received for U.S. Appl. No. 16/926,876 dated May 19, 2023, 39 pages.
Notice of Allowance received for U.S. Appl. No. 17/584,921 dated Jan. 19, 2023, 83 pages.
Notice of Allowance received for U.S. Appl. No. 17/584,921 dated May 5, 2023, 4 pages.
Notice of Allowance received for U.S. Appl. No. 17/584,940 dated Dec. 12, 2023, 114 pages.
Notice of Allowance received for U.S. Appl. No. 17/584,992 dated Mar. 20, 2024, 113 pages.
Notice of Allowance received for U.S. Appl. No. 17/692,880 dated Aug. 15, 2023, 43 pages.
Notice of Allowance received for U.S. Appl. No. 17/692,880 dated Sep. 6, 2023, 12 pages.
Notice of Allowance received for U.S. Appl. No. 17/692,880 dated Sep. 27, 2023, 12 pages.
Second Office Action received for Chinese Patent Application Serial No. 201880086817.1 dated Aug. 31, 2023, 10 pages.
Notice of Allowance received for U.S. Appl. No. 18/141,448 dated Feb. 14, 2024, 22 pages.
Notice of Allowance received for U.S. Appl. No. 18/198,790 dated Mar. 4, 2024, 58 pages.
Notice of Reasons for Rejection received for Japanese Patent Application Serial No. 2020-545047 dated Nov. 1, 2022, 10 pages.
Notice of Reasons for Rejection received for Japanese Patent Application Serial No. 2020-545048 dated Nov. 14, 2023, 6 pages.
Office Action received for Taiwan Patent Application Serial No. 111150645, dated Oct. 18, 2023, 12 pages.
Requirement for Restriction received for U.S. Appl. No. 17/245,825 dated Mar. 18, 2024, 8 pages.
Requirement for Restriction received for U.S. Appl. No. 18/495,452 dated Mar. 18, 2024, 8 pages.
Notice of Allowance received for U.S. Appl. No. 18/198,790 dated Mar. 22, 2024, 12 pages.
Non Final Office Action received for U.S. Appl. No. 18/198,788 dated Apr. 15, 2024, 15 pages.
Non Final Office Action received for U.S. Appl. No. 17/528,268 dated Apr. 18, 2024, 127 pages.
Non Final Office Action received for U.S. Appl. No. 18/450,652 dated Apr. 1, 2024, 29 pages.
Non Final Office Action received for U.S. Appl. No. 17/181,382 dated May 9, 2024, 111 pages.
Non Final Office Action received for U.S. Appl. No. 18/450,635 dated Mar. 28, 2024, 58 pages.
Final Office Action received for U.S. Appl. No. 16/871,613 dated Apr. 4, 2024, 12 pages.
Requirement for Restriction received for U.S. Appl. No. 17/401,422 dated May 8, 2024, 4 pages.
International Search Report and Written Opinion received for International PCT Application Serial No. PCT/US2024/011334 dated Jun. 21, 2024, 16 pages.
Non Final Office Action received for U.S. Appl. No. 18/494,452 dated Jun. 28, 2024, 52 pages.
Final Office Action received for U.S. Appl. No. 18/330,005, filed Jun. 14, 2024, 17 pages.
Non Final Office Action received for U.S. Appl. No. 18/116,207 dated Aug. 12, 2024, 22 pages.
Diop et al., 10 kV SiC MOSFET Evaluation for Dielectric Barrier Discharge Transformerless Power Supply, Aug. 18, 2020, Plasma, vol. 3, No. 3, pp. 103-116.
EPO, Extended European Search Report issued in EP Application No. 22856600.6, May 12, 2025, 9 pages.
KIPO, Notice of Grounds for Rejection issued in KR Application No. 10-2022-7042658, Jul. 10, 2025, 26 pages.
Rueda et al., Series Resonant Inverter Efficiency Improvement with Valley Switching for Dielectric Barrier Discharges, IEEE 2019 IEEE 13th International Conference Onpower Electronics and Drive Systems, Toulouse, France, Jul. 9-12, 2019, 6 pages.
Skibinski, Tomi Sweet, Office Action issued U.S. Appl. No. 18/656,543, filed May 15, 2025, 33 pages.
Non Final Office Action received for U.S. Appl. No. 13/596,976 dated Nov. 6, 2015, 77 pages.
Non Final Office Action received for U.S. Appl. No. 13/596,976 dated Nov. 25, 2016, 20 pages.
Non Final Office Action received for U.S. Appl. No. 13/597,032 dated Jun. 20, 2014, 42 pages.
Non Final Office Action received for U.S. Appl. No. 13/597,050 dated Jul. 17, 2015, 86 pages.
Non Final Office Action received for U.S. Appl. No. 13/597,093 dated Nov. 5, 2015, 76 pages.
Non Final Office Action received for U.S. Appl. No. 13/597,093 dated Nov. 10, 2016, 23 pages.
Non Final Office Action received for U.S. Appl. No. 14/011,305 dated Dec. 4, 2014, 28 pages.
Non Final Office Action received for U.S. Appl. No. 14/606,857 dated Apr. 8, 2015, 51 pages.
Non Final Office Action received for U.S. Appl. No. 14/740,955 dated Feb. 2, 2016, 16 pages.
Non Final Office Action received for U.S. Appl. No. 14/803,815 dated Jul. 3, 2018, 67 pages.
Non Final Office Action received for U.S. Appl. No. 15/667,239 dated Jun. 24, 2020, 131 pages.
Non Final Office Action received for U.S. Appl. No. 16/193,790 dated Sep. 4, 2019, 86 pages.
Non Final Office Action received for U.S. Appl. No. 16/194,104 dated Aug. 1, 2019, 83 pages.
Non Final Office Action received for U.S. Appl. No. 16/194,125 dated Dec. 12, 2019, 88 pages.
Non Final Office Action received for U.S. Appl. No. 16/278,822 dated Aug. 2, 2021, 107 pages.
Non Final Office Action received for U.S. Appl. No. 16/278,822 dated Sep. 14, 2022, 9 pages.
Non Final Office Action received for U.S. Appl. No. 16/557,209 dated May 12, 2022, 30 pages.
Non Final Office Action received for U.S. Appl. No. 16/926,876 dated Sep. 26, 2022, 7 pages.
Non Final Office Action received for U.S. Appl. No. 16/926,876 dated Sep. 29, 2022. 80 pages.
Non-Final Office Action received for U.S. Appl. No. 17/150,633 dated Nov. 24, 2021, 52 pages.
Non-Final Office Action received for U.S. Appl. No. 15/495,513 dated Jul. 2, 2020, 87 pages.
Non-Final Office Action received for U.S. Appl. No. 16/246,996 dated Dec. 12, 2019, 85 pages.
Non-Final Office Action received for U.S. Appl. No. 16/270,391 dated Dec. 12, 2019, 78 pages.
Non-Final Office Action received for U.S. Appl. No. 16/803,020 dated Apr. 22, 2020, 36 pages.
Non-Final Office Action received for U.S. Appl. No. 16/896,709 dated May 25, 2021, 50 pages.
Non-Final Office Action received for U.S. Appl. No. 17/031,027 dated Apr. 28, 2021, 29 pages.
Non-Final Office Action received for U.S. Appl. No. 17/171,164 dated Oct. 15, 2021, 59 pages.
Notice of Allowance received for U.S. Appl. No. 12/767,775 dated Jan. 22, 2016, 50 pages.
Notice of Allowance received for U.S. Appl. No. 12/870,837 dated Feb. 12, 2016, 6 pages.
Notice of Allowance received for U.S. Appl. No. 12/870,837 dated Jan. 20, 2016, 37 pages.
Notice of Allowance received for U.S. Appl. No. 13/193,299 dated Jul. 6, 2016, 6 pages.
Notice of Allowance received for U.S. Appl. No. 13/193,299 dated May 20, 2016, 9 pages.
Notice of Allowance received for U.S. Appl. No. 13/193,345 dated Feb. 4, 2016, 16 pages.

(56) References Cited

OTHER PUBLICATIONS

Notice of Allowance received for U.S. Appl. No. 13/193,345 dated Mar. 7, 2016, 8 pages.
Notice of Allowance received for U.S. Appl. No. 13/596,976 dated Jul. 31, 2017, 6 pages.
Notice of Allowance received for U.S. Appl. No. 13/596,976 dated May 8, 2017, 17 pages.
Notice of Allowance received for U.S. Appl. No. 13/596,976 dated May 17, 2017, 6 pages.
Notice of Allowance received for U.S. Appl. No. 13/597,032 dated Aug. 28, 2015, 41 pages.
Notice of Allowance received for U.S. Appl. No. 13/597,050 dated Apr. 13, 2016, 15 pages.
Notice of Allowance received for U.S. Appl. No. 13/597,050 dated Apr. 20, 2016, 6 pages.
Notice of Allowance received for U.S. Appl. No. 13/597,093 dated Apr. 19, 2017, 2 pages.
Notice of Allowance received for U.S. Appl. No. 13/597,093 dated Mar. 17, 2017, 13 pages.
Notice of Allowance received for U.S. Appl. No. 14/011,305 dated Jun. 5, 2015, 24 pages.
Notice of Allowance received for U.S. Appl. No. 14/606,857 dated Sep. 24, 2015, 31 pages.
Notice of Allowance received for U.S. Appl. No. 15/495,513 dated Jul. 26, 2021, 18 pages.
Notice of Allowance received for U.S. Appl. No. 15/495,513 dated Oct. 27, 2021, 8 pages.
Notice of Allowance received for U.S. Appl. No. 15/667,239 dated Jan. 13, 2021, 26 pages.
Notice of Allowance received for U.S. Appl. No. 16/193,790 dated Jan. 23, 2020, 16 pages.
Notice of Allowance received for U.S. Appl. No. 16/193,790 dated Nov. 20, 2019, 40 pages.
Notice of Allowance received for U.S. Appl. No. 16/194,104 dated Mar. 2, 2020, 55 pages.
Office Action received for Korean Patent Application Serial No. 1020147004544 dated Feb. 3, 2016, 13 pages.
Office Action received for Korean Patent Application Serial No. 1020157006726 dated Feb. 19, 2018, 10 pages.
Office Action received for Korean Patent Application Serial No. 1020157007273 dated Jan. 30, 2018, 8 pages.
Office Action received for Korean Patent Application Serial No. 1020157007516 dated Feb. 15, 2017, 18 pages.
Office Action received for Taiwan Patent Application Serial No. 107140922 dated Feb. 1, 2021, 9 pages.
Office Action received for Taiwan Patent Application Serial No. 110136912 dated Feb. 23, 2022, 10 pages.
Office Action received for Taiwanese Patent Application Serial No. 102130565 dated Apr. 11, 2016, 2 pages.
Office Action received for Taiwanese Patent Application Serial No. 099113815 dated Jan. 27, 2014, 6 pages.
Office Action received for Taiwanese Patent Application Serial No. 099113815 dated Jun. 18, 2014, 5 pages.
Office Action received for Taiwanese Patent Application Serial No. 101127182 dated Aug. 11, 2014, 11 pages.
Office Action received for Taiwanese Patent Application Serial No. 102130565 dated Aug. 20, 2015, 4 pages.
Office Action received for Taiwanese Patent Application Serial No. 102130565 dated Jul. 14, 2015, 4 pages.
Office Action received for Taiwanese Patent Application Serial No. 102130984 dated Feb. 19, 2016, 4 pages.
Office Action received for Taiwanese Patent Application Serial No. 107140924 dated Apr. 28, 2020, 14 pages.
Office Action Received for Taiwanese Patent Application Serial No. 107140924 dated Jan. 15, 2021, 12 pages.
Office Action received for Taiwanese Patent Application Serial No. 107140926 dated May 28, 2020, 12 pages.
Office Action received for Taiwanese U.S. Appl. No. 10/714,924 dated Aug. 18, 2021, 5 pages.
Office Action received for Taiwanese Patent Application Serial No. Re: Taiwan Patent Application No. 110111617 dated Jun. 30, 2022, 8 pages.
Office Action rereceived for Japanese Patent Application Serial No. 2012508593 dated Sep. 11, 2013, 7 pages.
Ohachi, T., et al., "Measurement of Nitrogen Atomic Flux for RF-MBE Growth of GaN and AlN on Si Substrates", J. of Crystal Growth, vol. 311, 2009, pp. 2987-2991.
Raoux, S., et al., "Remote Microwave Plasma Source for Cleaning Chemical Vapor Deposition Chambers; Technology for Reducing Global Warming Gas Emissions", J. Vac. Sci. Technol. B, vol. 17, No. 2, Mar./Apr. 1999, pp. 477-485.
Rauf, S., et al., "Nonlinear Dynamics of Radio Frequency Plasma Processing Reactors Powered by Multifrequency Sources", IEEE Transactions on Plasma Science, vol. 27, No. 5, Oct. 5, 1999, pp. 1329-1338.
Requirement for Restriction received for U.S. Appl. No. 12/870,837 dated Dec. 19, 2012, 8 pages.
Requirement for Restriction received for U.S. Appl. No. 13/193,299 dated Aug. 8, 2013, 7 pages.
Requirement for Restriction received for U.S. Appl. No. 13/193,345 dated Jun. 6, 2013, 8 pages.
Requirement for Restriction received for U.S. Appl. No. 13/596,976 dated Feb. 23, 2015, 8 pages.
Requirement for Restriction received for U.S. Appl. No. 13/597,050 dated Jan. 27, 2015, 7 pages.
Requirement for Restriction received for U.S. Appl. No. 13/597,093 dated Mar. 23, 2015, 9 pages.
Requirement for Restriction received for U.S. Appl. No. 14/011,305 dated Aug. 15, 2014, 14 pages.
Requirement for Restriction received for U.S. Appl. No. 14/803,815 dated Nov. 17, 2017, 8 pages.
Requirement for Restriction received for U.S. Appl. No. 15/495,513 dated Nov. 29, 2019, 6 pages.
Requirement for Restriction received for U.S. Appl. No. 15/667,239 dated Dec. 23, 2019, 6 pages.
Requirement for Restriction received for U.S. Appl. No. 16/557,209 dated Sep. 21, 2021, 6 pages.
Requirement for Restriction received for U.S. Appl. No. 16/926,876 dated Apr. 29, 2022, 9 pages.
Second Office Action received for Chinese Patent Application Serial No. 201080003206.X dated May 23, 2014, 6 pages.
Second Office Action received for Chinese Patent Application Serial No. 201710704712.5 dated Sep. 27, 2019. 11 pages.
Second Office Action received for Chinese Patent Application Serial No. 201711336133.6 dated Jan. 6, 2020, 7 pages.
Silapunt, R., et al., "Ion Bombardment Energy Control for Selective Fluorocarbon Plasma Etching of Organosilicate Glass, J. Vac. Sci. Technol", vol. B 22, No. 2, 2004, pp. 826-831.
Specification for related U.S. Appl. No. 13/173,752, filed Jun. 30, 2011, 48 pages.
Specification for related U.S. Appl. No. 13/425,159, filed Mar. 20, 2012, 33 pages.
Third Office Action received for Chinese Patent Application Serial No. 201080003206.X dated Nov. 26, 2014, 6 pages.
Third Office Action received for Chinese Patent Application Serial No. 201710704712.5 dated Jan. 3, 2020, 8 pages.
Third Office Action received for Chinese Patent Application Serial No. 201711336133.6 dated Oct. 10, 2020, 21 pages.
Vahedi, V., et al., "Verification of Frequency Scaling Laws for Capacitive Radio-Frequency Discharges Using Two-Dimensional Simulations", Phys. Fluids B, , vol. 5, No. 7, Jul. 1993, pp. 2719-2729.
Wakeham, S.J., et al . . . , "Low Temperature Remote Plasma Sputtering of Indium Tin Oxide for Flexible Display Applications", Thin Solid Films, vol. 519, 2009, pp. 1355-1358.
Wang, S.B., et al., "Control of Ion Energy Distribution at Substrates During Plasma Processing", J. Applied Physics, vol. 88, No. 2, Jul. 15, 2000, pp. 643-646.
Wendt "Thomson Innovation Patent Export", Mar. 10, 2009, 10 pages.

(56) References Cited

OTHER PUBLICATIONS

Xiubo, et al., "Charging of Dielectric Substrate Materials During Plasma Immersion Ion Implantation", Nuclear Instruments and Methods in Physics Research B, vol. 187, 2002, pp. 485-491.
Yun, Y.B., et al., "Effects of Various Additive Gases on Chemical Dry Etching Rate Enhancement of Low-k SiOCH Layer in F2/Ar Remote Plasmas", Thin Solid Films, vol. 516, 2008, pp. 3549-3553.
Notice of Allowance received for U.S. Appl. No. 16/194,104 dated Mar. 27, 2020, 37 pages.
Final Office Action received for U.S. Appl. No. 18/350,516, mailed on Aug. 7, 2025, 29 pages.
Final Office Action received for U.S. Appl. No. 18/670,168 dated Sep. 11, 2025, 6 pages.
International Preliminary Report on Patentability received for PCT Patent Application No. PCT/US2024/011334, mailed on Jul. 24, 2025, 7 pages.
International Search Report and Written Opinion received for PCT Patent Application No. PCT/US2025/040171, mailed on Oct. 8, 2025, 17 pages.
Non-Final Office Action received for U.S. Appl. No. 18/518,840 mailed on Sep. 23, 2025, 9 pages.
Non-Final Office Action received for U.S. Appl. No. 18/670,168 dated Aug. 29, 2025, 5 pages.
Notice of Allowance received for JP Patent Application Serial No. 2022-568414, dated Jul. 29, 2025, 4 pages.
Office Action received for European Application No. 24742051.6, mailed on Aug. 20, 2025, 3 pages.
Office Action received for Japanse Patent Application No. 2024-215046, mailed on Jun. 26, 2025, 3 pages (2 pages of original office action and 1 page of English Translation).
Final Office Action received for U.S. Appl. No. 18/518,840, mailed on Apr. 3, 2026, 11 pages.
MOIP, Notice of Grounds for Rejection issued in Korean Patent Application No. 10-2024-7008015, on Feb. 24, 2026, 13 pages.
Non-Final Office Action received for U.S. Appl. No. 18/096,478, mailed on Apr. 2, 2026, 21 pages.
Non-Final Office Action received for U.S. Appl. No. 18/670,168, mailed on Apr. 1, 2026, 13 pages.
Final Office Action received for U.S. Appl. No. 17/401,422, mailed on Dec. 3, 2025, 7 pages.
International Search Report and Written Opinion received for PCT Patent Application No. PCT/US2025/055206, mailed on Feb. 3, 2026, 20 pages.
Non-Final Office Action received for U.S. Appl. No. 18/946,058, mailed on Jan. 29, 2026, 16 pages.
Notice of Allowance received for U.S. Appl. No. 18/350,516, mailed on Jan. 16, 2026, 9 pages.
Notice of Allowance received for U.S. Appl. No. 18/670,168, mailed on Nov. 25, 2025, 7 pages.
Office Action received for Taiwanese Patent Application No. 114119273, mailed on Jan. 8, 2026, 20 pages (10 pages of English Translation and 10 pages of Original Document).
Requirement for Restriction/Election received for U.S. Appl. No. 18/096,478, mailed on Dec. 10, 2025, 6 pages.
Non-Final Office Action received for U.S. Appl. No. 17/401,422, mailed on May 5, 2026, 8 pages.
Non-Final Office Action received for U.S. Appl. No. 18/591,261, mailed on May 7, 2026, 13 pages.
Non-Final Office Action received for U.S. Appl. No. 18/830,709, mailed on May 1, 2026, 10 pages.
Office Action received for Korean Patent Application No. 10-2024-7008015 , mailed on Feb. 24, 2026, 13 pages (7 pages of original office action and 6 pages of English Translation).
Office Action received for Malaysia Patent Application No. PI2022006188, mailed on Oct. 3, 2025, 4 pages.
Office Action received for Taiwanese Patent Application No. 111130474, mailed on Apr. 13, 2026, 20 pages (9 pages of English Translation and 11 pages of Original Document).
Requirement for Restriction/Election received for U.S. Appl. No. 18/584,816, mailed on May 13, 2026, 8 pages.

* cited by examiner

PULSE-MODE CONTROL IN A BIAS SUPPLY

BACKGROUND

Field

The present invention relates generally to power supplies, and more specifically to power supplies for applying a voltage for plasma processing.

Background

Many types of semiconductor devices are fabricated using plasma-based etching techniques. If it is a conductor that is etched, a negative voltage with respect to ground may be applied to the conductive substrate to create a substantially uniform negative voltage across the surface of the substrate conductor, which attracts positively charged ions toward the conductor, and as a consequence, the positive ions that impact the conductor have substantially the same energy.

If the substrate is a dielectric, however, a non-varying voltage is ineffective to place a voltage across the surface of the substrate. But an alternating current (AC) voltage (e.g., high frequency AC or time varying periodic voltage waveform may be applied by a bias supply to the conductive plate (or chuck) so that the AC field induces a voltage on the surface of the substrate. During a negative portion of the applied waveform, the surface of the substrate will be charged negatively, which causes ions to be attracted toward the negatively-charged surface during the negative portion of the periodic cycle. And when the ions impact the surface of the substrate, the impact dislodges material from the surface of the substrate—effectuating the etching.

During operation of a bias supply, the bias supply undergoes state changes such as from an off state to an on state. In addition, the periodic waveform may by changed, consistent with state changes, to effectuate different ion energy distribution functions (IEDFs). For example, on directionality, feature profile, and selectivity to a mask and a stop-layer may be controlled by making state changed to the bias supply to adjust the IEDF.

In recent years, advanced plasma processing systems have turned to using pulsed plasmas for several reasons. In one instance, pulsing is used to reduce the average energy imparted to a wafer. For example, to achieve a desired etch rate or depth of an etched feature, high powers, such as ten or more kilowatts of bias power, may be used. Unfortunately, continuous application of such high power might damage the wafer or process hardware, so pulsing of a source supply is used to reduce average power delivered by reducing the duty cycle. In another instance, pulsing is used to control the electron temperature in the plasma.

SUMMARY

In some aspects, the techniques described herein relate to an apparatus to produce a waveform, the apparatus including: at least one switch in a current path that couples a first node to a second node; a power supply coupled to the current path; a controller configured to: while the power supply is applying power, repeatedly close and open the at least one switch to produce peak voltages and portions between the peak voltages; and while the power supply is not applying power, close the at least one switch to circulate current through the at least one switch and the power supply.

In some aspects, the techniques described herein relate to an apparatus, wherein the controller is configured to control the power supply to apply power in advance of an ON pulse.

In some aspects, the techniques described herein relate to an apparatus, wherein the controller is configured to receive a signal that indicates when the ON pulse begins.

In some aspects, the techniques described herein relate to an apparatus, wherein the second node is coupled to the first node via a first inductor to form the current path.

In some aspects, the techniques described herein relate to an apparatus, wherein the power supply is arranged in series with a second inductor, and the series arrangement of the power supply and the second inductor is coupled between the current path and the second node.

In some aspects, the techniques described herein relate to an apparatus, wherein the current is circulated through the at least one switch, the second inductor, and the power supply.

In some aspects, the techniques described herein relate to an apparatus, wherein the power supply is controllable to control current provided to the first node to control a ramped voltage between each of the peak voltages at the first node.

In some aspects, the techniques described herein relate to a method for producing a waveform including: applying, during an ON pulse, a waveform using switching in connection with a DC voltage; removing the DC voltage while circulating current during an OFF pulse; reapplying, in advance of another ON pulse, the DC voltage; and initiating the switching after reapplying the DC voltage to reapply the waveform during another ON pulse.

In some aspects, the techniques described herein relate to a method, wherein applying the waveform includes repeatedly coupling a voltage to, and decoupling the voltage from, a first node to produce peaks of the waveform.

In some aspects, the techniques described herein relate to a method, wherein applying the waveform includes repeatedly coupling the first node to, and decoupling the first node from, a second node via a switch and a first inductor to produce the peaks of the waveform.

In some aspects, the techniques described herein relate to a method including: providing the DC voltage to a second inductor to produce current to create a negative voltage ramp between each of the peaks of the waveform.

In some aspects, the techniques described herein relate to a method, wherein each cycle of the waveform includes a peak voltage, a voltage step following the peak voltage, and a ramped voltage following the voltage step.

In some aspects, the techniques described herein relate to a method, wherein the DC voltage is a greater magnitude than −1000 volts.

In some aspects, the techniques described herein relate to a system, the system including: a source generator configured to apply pulsed power to a plasma chamber; and a bias supply configured to: apply, during an ON pulse of the source generator, a waveform using switching in connection with a DC voltage; removing the DC voltage while circulating current during an OFF pulse of the source generator; reapply, in advance of another ON pulse, the DC voltage; and initiating the switching after reapplying the DC voltage to reapply the waveform during the other ON pulse.

In some aspects, the techniques described herein relate to a system, wherein the bias supply is configured to apply the waveform by repeatedly coupling a voltage to, and decoupling the voltage from, a first node to produce peaks of the waveform.

In some aspects, the techniques described herein relate to a system, wherein the bias supply is configured to apply the waveform by repeatedly coupling the first node to, and decoupling the first node from, a second node via a switch and a first inductor to produce the peaks of the waveform.

In some aspects, the techniques described herein relate to a system wherein the bias supply is configured to provide the DC voltage to a second inductor to produce current to create a negative voltage ramp between each of the peaks of the waveform.

In some aspects, the techniques described herein relate to a system, wherein each cycle of the waveform includes a peak voltage, a voltage step following the peak voltage, and a ramped voltage following the voltage step.

In some aspects, the techniques described herein relate to a system, wherein the DC voltage is a greater magnitude than −1000 volts.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments. In this regard, some blocks in these flowcharts or block diagrams may represent a module, segment, or portion of code, which comprises one or more executable instructions for implementing the specified logical function(s). The instructions may be executable by a processor or may be used to program a field programmable gate array. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

For the purposes of this disclosure, source generators, source supplies, or excitation supplies are those whose energy is primarily directed to generating and sustaining the plasma, while "bias supplies" are those whose energy is primarily directed to generating a surface potential for attracting ions and electrons from the plasma.

Applicant has found that when a bias supply undergoes state changes, the periodic voltage waveform and/or current waveform output by the bias supply may have undesirable rise and/or fall times. An aspect of the present disclosure is control, during a transition between one operational state of a bias supply to another operational state of the bias supply, to mitigate against slow rise and/or fall times. The state changes that the bias supply undergoes may or may not be in the context of a pulsed plasma, and the transition control may occur on an ongoing basis while applying state changes to effectuate a specific recipe that is applied to a workpiece (also referred to herein as a substrate).

Figure 1:
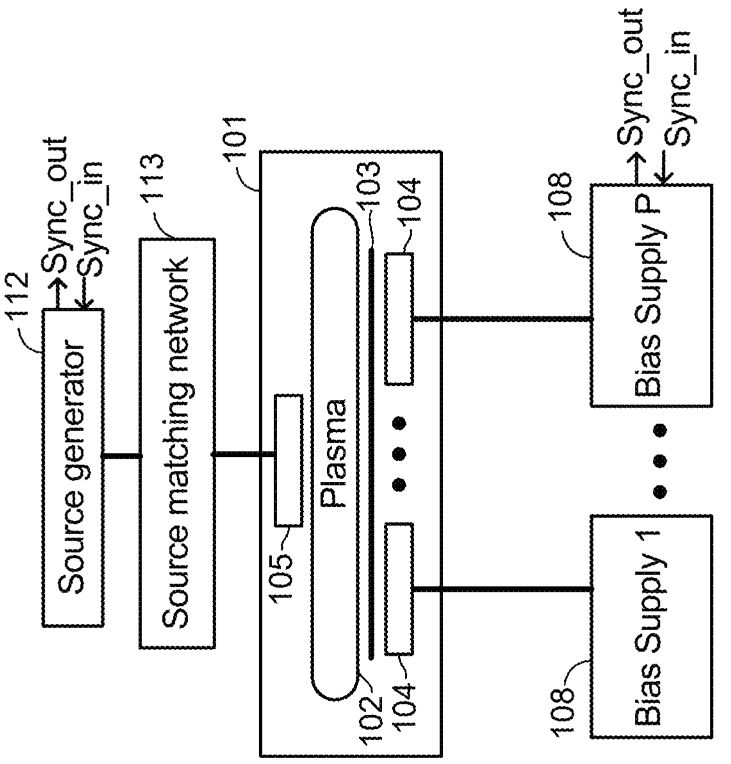
FIG. 1 is a block diagram depicting an exemplary plasma processing environment.

Referring first to FIG. 1, shown is an exemplary plasma processing environment (e.g., deposition or etch system) in which bias supplies may be utilized. The plasma processing environment may include many pieces of equipment coupled directly and indirectly to a plasma processing chamber 101, within which a volume containing a plasma 102 and workpiece 103 (e.g., a wafer) and electrodes 104 (which may be embedded in a substrate support) are contained. The equipment may include vacuum handling and gas delivery equipment (not shown), one or more bias supplies 108, one or more source generators 112, and one or more source matching networks 113. In many applications, power from a single source generator 112 is connected to one or multiple source electrodes 105. The source generator 112 may be a higher frequency RF generator (e.g., 13.56 MHz to 120 MHz). The electrode 105 generically represents what may be implemented with an inductively coupled plasma (ICP) source, a dual capacitively-coupled plasma source (CCP) having a secondary top electrode biased at another RF frequency, a helicon plasma source, a microwave plasma source, a magnetron, or some other independently operated source of plasma energy.

In variations of the system depicted in FIG. 1, the source generator 112 and source matching network 113 may be replaced by, or augmented with, a remote plasma source. And other variations of the system may include only a single bias supply 108. It should be recognized that many other variations of the plasma processing environment depicted in FIG. 1 may be utilized. As examples without limitation, U.S. Pat. No. 10,707,055, issued Jul. 7, 2020 and U.S. Pat. No. 10,811,227, issued Oct. 20, 2020, both of which are incorporated by reference in their entirety, disclose various types of system designs.

As shown in FIG. 1, each of the source generator 112 and the bias supply 108 may receive a synchronization signal, sync_in, and each of the source generator 112 and the bias supply 108 may provide a synchronization signal, sync_out. One of ordinary skill in the art will ready appreciate that the source generator 112 may operate as a main supply (providing the sync_out signal) while a bias supply 108 operates as a satellite supply (receiving the sync_in signal), or the bias supply 108 may operate as a main supply (providing the sync_out signal) while the source supply operates as a satellite supply (receiving the sync_in) signal.

Figure 6:
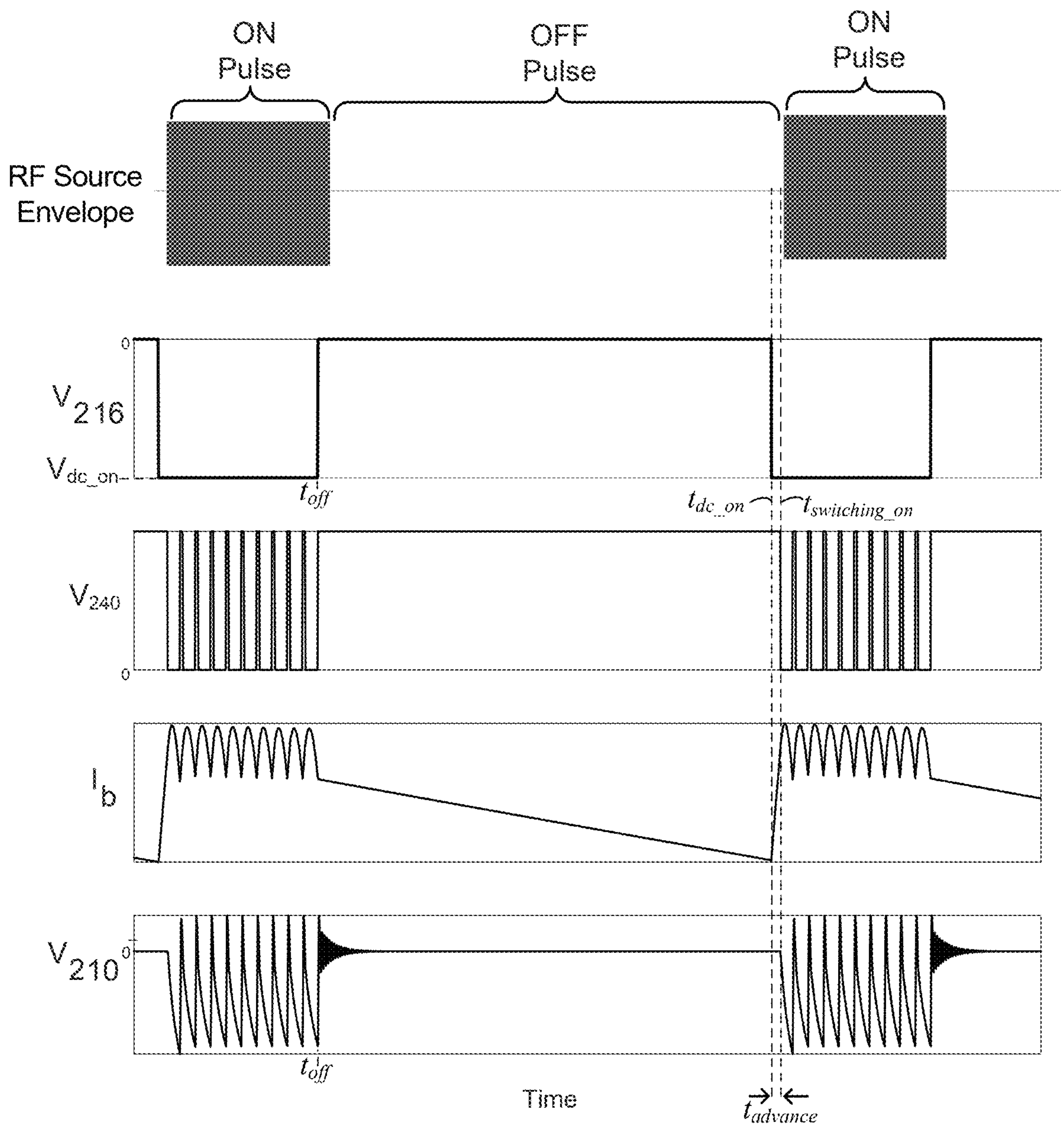
FIG. 6 is a diagram depicting graphs representing examples of pulses of a source generator and operation of a bias supply.

The synchronization between the source generator 112 and the bias supply 108 enables a pulse mode of operation in the depicted system. Referring briefly to FIG. 6 for example, shown is an RF source envelope that may be provided by the source generator 112. As shown, the RF source envelope may change from an ON pulse to an OFF pulse, and the bias supply 108 may output multiple cycles of a periodic voltage waveform, $V_{210}$, during each pulse ON pulse. Although not shown in FIG. 6, it is certainly contemplated that the magnitude of the output of the source generator 112 may change and the voltage levels of the periodic voltage waveform may change from pulse to pulse. In FIG. 6, the cycles of the periodic voltage waveform, $V_{210}$, are depicted while the cycles of the source generator are not depicted because (typically) the frequency of the periodic voltage waveform is hundreds of kilohertz (e.g., 400 kHz), and in contrast, the frequency of the source generator 112 may be in the megahertz (e.g., 13.56 MHz). As a consequence, the waveform of the source generator 112 is not shown in FIG. 6, and instead, envelopes are shown.

It should be recognized that, while the following disclosure generally refers to plasma-based wafer processing, implementations can include any substrate processing within a plasma chamber. In some instances, objects other than a substrate can be processed using the systems, methods, and apparatus herein disclosed. In other words, this disclosure applies to plasma processing of any object within a sub-atmospheric plasma processing chamber to affect a surface change, subsurface change, deposition or removal by physical or chemical means.

Figure 2:
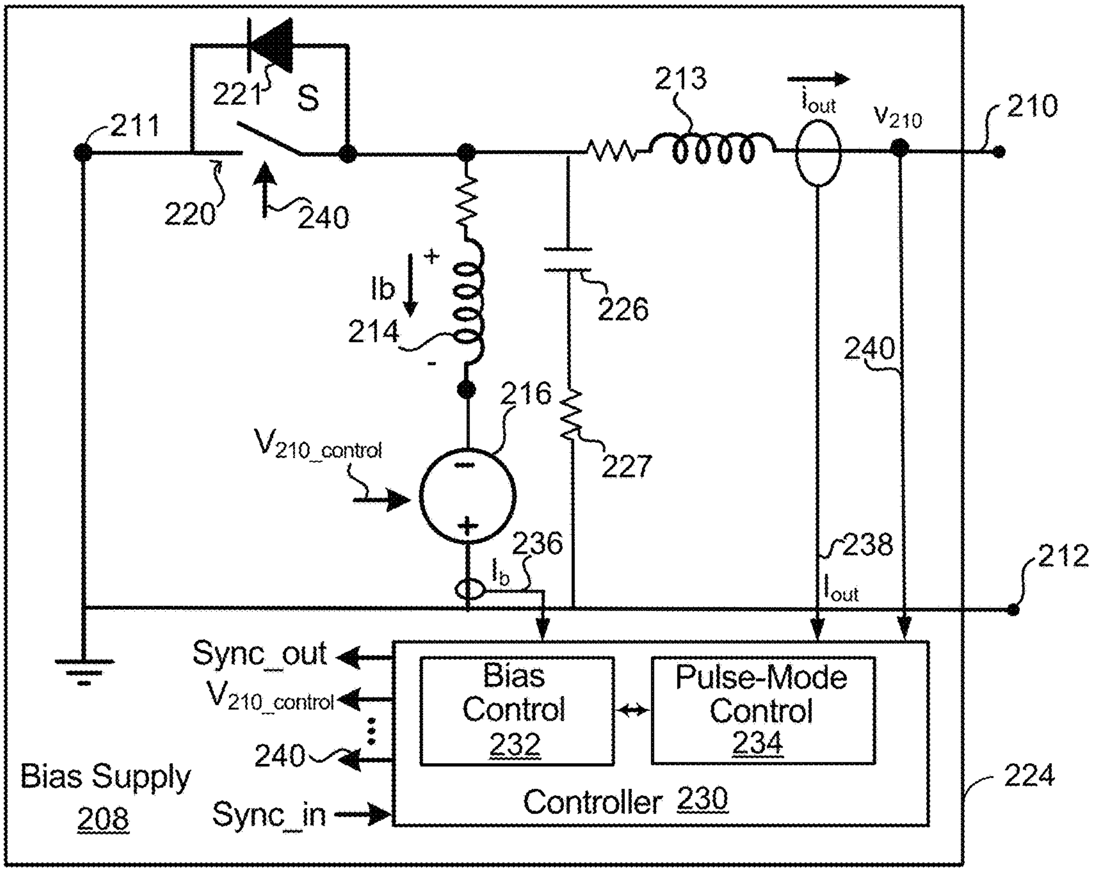
FIG. 2 is a schematic diagram depicting an exemplary bias supply.

Referring to FIG. 2, shown is an exemplary bias supply 208 that may be utilized to implement the bias supplies 108 described with reference to FIG. 1. It should be recognized that the bias supply 208 depicts only an example of a topology that may be utilized and the bias supply 208 may be realized by variations of the depicted topology. As shown, the bias supply 208 includes a first node 210 (which may be an output node), second node 211, and a third node 212 (which may be a return node), a first inductor 213, a series combination of a second inductor 214 and a power supply 216, and a switch 220. As shown, a diode 221 is in parallel with the conduction path of the switch 220, and this diode 221 may be an intrinsic diode (e.g., when the switch 220 is realized by a MOSFET), or the diode 221 may be added as an external diode. As discussed further herein, the power supply may be a DC power supply that is capable of providing a range of DC voltages and is capable of being turned on and off responsive to a $V_{210}$ control signal. The DC voltages may be, for example and without limitation, negative voltages in the hundreds of volts or may be several thousand volts. As a specific example, a magnitude of the DC voltage may be greater than −1000 volts.

As shown, the switch 220 couples the second node 211 to the first node 210 via the first inductor 213 to form (when the switch 220 is closed) a current path between the second node 211 and the first node 210, and the series combination of the power supply 216 and the second inductor 214 are coupled between the third node 212 and the current path that comprises the switch 220 and the first inductor 213. Also shown is an optional snubber capacitor 226 that may be arranged in series with an optional resistor 227 to form a resistance-capacitance branch. It should be recognized that the resistor 227 is optional if the snubber capacitor 226 is utilized. As discussed further herein, the waveform at the first node may be produced by repeatedly coupling a voltage (e.g., a voltage at the second node 211) to, and decoupling the voltage from, the first node 210 to produce peaks of the waveform. More specifically, the first node 210 may be repeatedly coupled to, and decoupled from, the voltage at the second node 211 via the switch 220 and the first inductor 213 to produce the peaks of the waveform. And as discussed further herein, providing the DC voltage from the power supply 216 to the second inductor 214 produces current to create a negative voltage ramp between each of the peaks of the waveform.

In general, the bias supply 208 functions to apply an asymmetric periodic voltage function while also being capable of operating in a pulse mode. In the depicted embodiment, current delivered to a load through the first node 210 is returned to the bias supply 208 through the third node 212 that may be common with the load.

FIG. 2 also depicts examples of electrical parameters that are associated with the bias supply 208 including inductor current, Ib, that flows through the second inductor 214, which may be measured along a current path that includes the inductor 214 and the power supply 216. Yet another electrical parameter that may be measured is output current, Iout, which may be measured along the current path, as shown, between the switch 220 and the first node 210. In addition, the output voltage, $V_{210}$, is another electrical parameter that may be measured and utilized as described herein. $V_{210}$, for example, may be the voltage across the first node 210 and the third node 212. As described herein, the third node 212 may be grounded in some variations of the bias supply 208 or may be another non-zero voltage. It should be recognized that other electrical parameters of the bias supply 208 may be monitored and/or measured depending upon the particular design of the bias supply 208.

As shown, the bias supply 208 may include a controller 230 that functions to control the power supply 216 and the switch 220 based upon one or more settings and one or more of the electrical parameters (e.g., Ib, Iout, and $V_{210}$). The controller 230 may reside within a housing 224 of the bias supply 208, or alternatively, may reside external to the housing 224 of the bias supply 208. When implemented external to the housing 224 of the power supply 208, the controller 230 may be implemented as a portion of a centralized controller that controls several pieces of processing equipment such as, for example and without limitation, the bias supply 208, the source generator 112, the source matching network 113, other bias supplies 208, mass flow controllers, and other components. The controller 230 may also be distributed between the bias supply 208 and control-related components that are external to the bias supply 208. It is also contemplated that the controller 230 may be implemented within a housing of another piece of equipment such as the source generator 112 or the controller 230 may be implemented as a distributed controller that resides in several pieces of equipment.

As shown, the controller 230 comprises a bias control portion 232 and a pulse-mode control module 234. The depiction of the bias control portion 232 and the pulse-mode control module 234 is logical for purposes of describing functional aspects of the controller 230, but is should be recognized that the bias control portion 232 and the pulse-mode control module 234 may be realized by common hardware constructs. For example, the bias control portion 232 and the pulse-mode control module 234 may share one or more common processors and/or field programmable gate arrays (FPGAs). As one of ordinary skill in the art will appreciate, processor executable instructions and/or instructions to program an FPGA may be utilized to effectuate control methods described further herein.

The controller 230 may receive and may provide several signals. For example, without limitation, the controller 230 may receive a signal 236 indicative of Ib, a signal 238 indicative of Iout, a signal 240 indicative of $V_{210}$, and a sync_in signal. In addition, the controller 230 may provide several signals including and without limitation, a gate drive signal 240 to control the switching of the switch 220; a sync_out signal that may be used when the bias supply is operating as a main supply; and the $V_{210\_control}$ signal to control the magnitude of the voltage output by the power supply 216. As one of ordinary skill in the art will appreciate, these signals may be analog or may be digital signals.

In general, the bias control portion 232 is configured to control the switch 220 and the power supply 216 to effectuate desired aspects of the asymmetrical periodic voltage waveform (as described further herein) that is applied to the first node 210 and the third node 212. The pulse-mode control module 234 generally operates, as described further herein, in connection with the bias control portion 232 to modify operation of the bias control portion 232 during transitions between control states to result in increased rise and fall times of the periodic voltage waveform from one control state to another control state. The bias control portion 232 and the pulse-mode control module 234 may be realized by hardware in connection with software (e.g., as firmware). For example, algorithms for effectuating the functions of the pulse-mode control module 234 may be embodied in processor executable code that is executed by a processor. Prior art bias supplies are not capable of the pulse-mode control functionality, at least, because they have not been programmed to be configured as described herein. More detail about the operation of the bias supply 208 are provided further herein, but first it is helpful to understand aspects of a plasma load.

Figure 3:
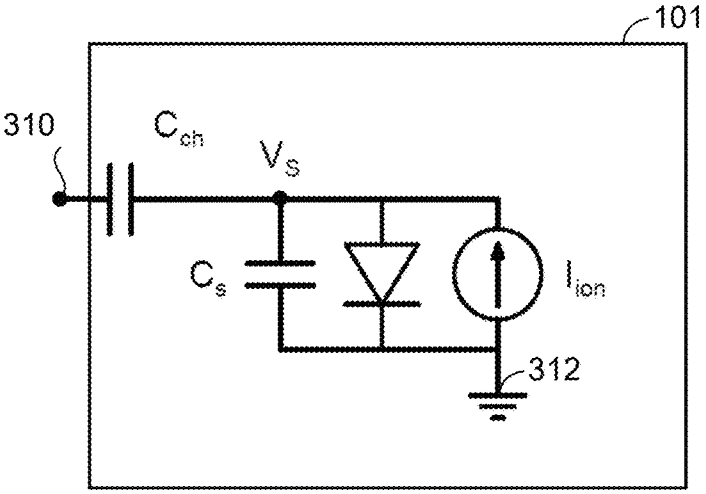
FIG. 3 is a schematic diagram electrically representing aspects of a plasma processing chamber.

Referring briefly to FIG. 3, shown is a schematic drawing that electrically depicts aspects of an exemplary plasma load within the plasma processing chamber 101. As shown, the plasma processing chamber 101 may be represented by a chuck capacitance $C_{ch}$ (that includes a capacitance of a chuck and workpiece 103) that is positioned between an input 310 (also referred to as an input node 310) to the plasma processing chamber 101 and a node representing a sheath voltage, $V_S$, at a surface of the workpiece 103 (also referred to as a wafer substrate 103). As a consequence, references to the sheath voltage, $V_S$, are also referred to herein as a voltage at a surface of the wafer or substrate. In addition, a return node 312 (which may be a connection to ground) is depicted. The plasma 102 in the processing chamber is represented by a parallel combination of a sheath capacitance $C_S$, a diode, and a current source. The diode represents the non-linear, diode-like nature of the plasma sheath that results in rectification of the applied AC field, such that a direct-current (DC) voltage drop, appears between the workpiece 103 and the plasma 102.

Figure 4:
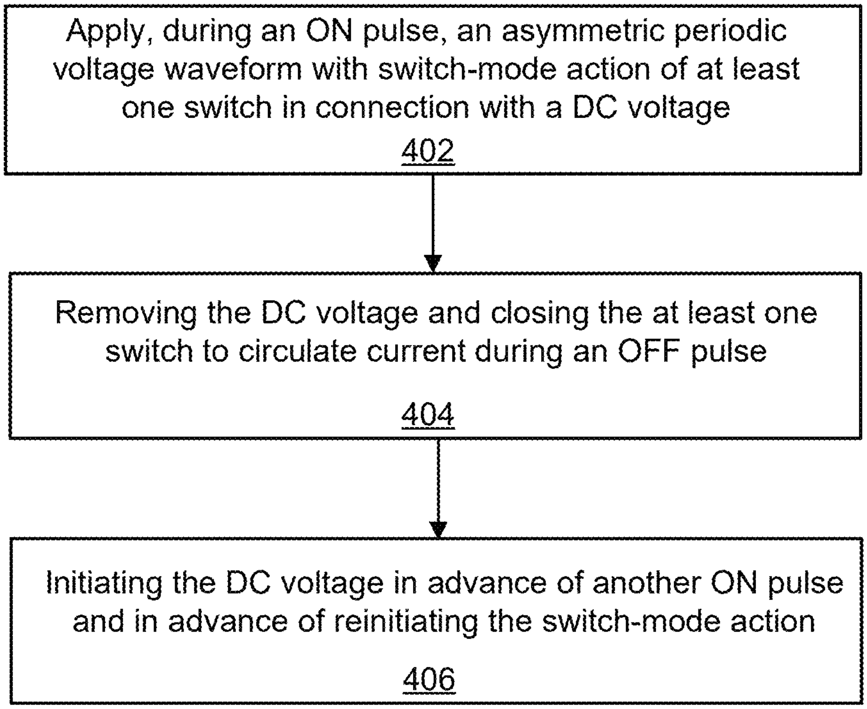
FIG. 4 is a flowchart depicting a method.
Figure 5:
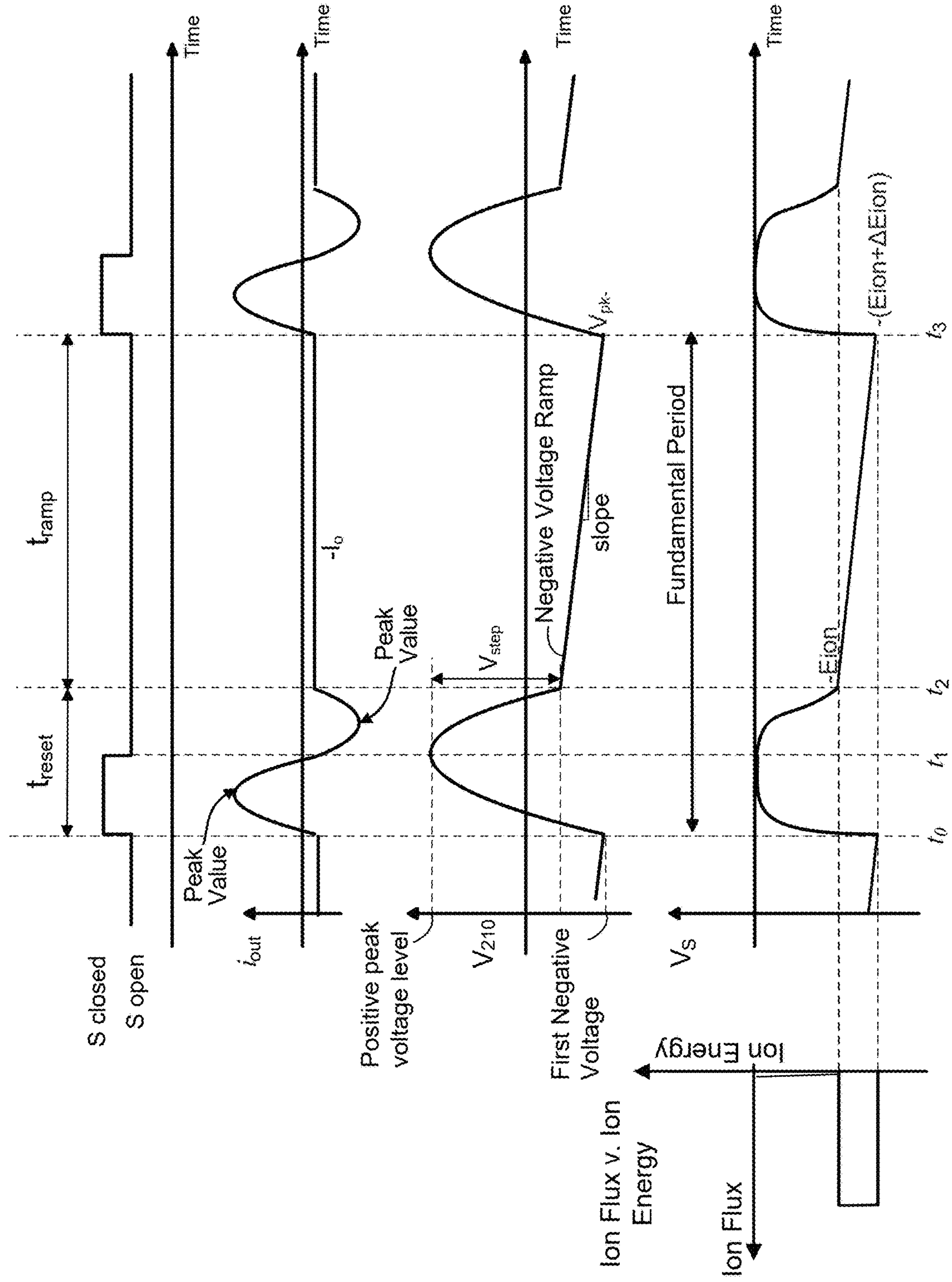
FIG. 5 depicts graphs and a timing diagram depicting operational aspects of a bias supply.

Referring back to FIG. 2, simultaneous reference is made to FIG. 4, which is a flowchart depicting a control method that may be traversed in connection with embodiments disclosed herein. In addition, reference is also made to FIG. 5 and FIG. 6. FIG. 5 depicts an example timing diagram for the switch 220 in connection with an asymmetric periodic waveform, $V_{210}$, at node 210, and FIG. 6 depicts several parameters for the source generator 112 and the bias supply 208. As shown, during an ON pulse (shown in FIG. 6), an asymmetric periodic voltage waveform, $V_{210}$, is applied with switch-mode action (of the switch 220) in connection with a DC voltage, $V_{216}$, from the power supply 216 (Block 402). More specifically, while the power supply 216 is applying the DC voltage $V_{216}$ (shown in FIG. 6), to produce a cycle of the asymmetric periodic waveform, as shown in FIG. 5, the switch 220 is closed and opened to produce a peak voltage at the first node 210 before a voltage at the first node drops by a voltage step, Vstep, followed by a negative voltage ramp. The DC voltage $V_{216}$ applied by the power supply 216 may be a negative voltage, Vdc_on, that may be for example, hundreds of negative volts or thousands of negative volts.

Referring again to FIG. 5, an asymmetric periodic voltage waveform, V210, (from time t0 to t3) may comprise a first portion (from time t0 to t1) that begins with a first negative voltage and changes to a positive peak voltage (at time t1) during the first portion, the asymmetric periodic voltage also changes from the first portion to a third voltage level (at time t2) during a second portion (from time t1 to t2), and the asymmetric periodic voltage waveform comprises a third portion (from time t2 to t3) that includes a voltage ramp between the third voltage level and a fourth, negative voltage level (at time t3).

As shown in FIG. 5, the asymmetric periodic voltage waveform also comprises the voltage step, Vstep, between times t1 and t2, and Vstep corresponds to a sheath voltage at t2 that produces ions at any energy level, −Eion. And during the third portion of the asymmetric periodic voltage waveform, the sheath voltage may become more negative so that at t3, ions at an energy level of Eion+ΔEion are produced. Also shown in FIG. 5 is a negative voltage peak, Vpk−, which identifies an end to the third portion of the asymmetric periodic voltage function. The negative voltage peak, Vpk− may be used as a control parameter. For example, a threshold value for the negative voltage peak, Vpk− may trigger the closing of the switch 220.

A fundamental period (from t0 to t3) of the asymmetric periodic voltage waveform may be adjusted to adjust a spread of ion energies. As shown in FIG. 5, a full current cycle occurs between times t0 and t2 during the first and second portions of the asymmetric periodic voltage waveform. And the time between full current cycles is the time, tramp, between t2 and t3.

As shown, the switch 220 may be controlled so that output current, $I_{out}$, completes a full cycle from $-I_o$ to a peak value, back to $-I_o$, to a peak value in an opposite direction and back to $-I_o$. It should be recognized the peak value of the current in a first half of the current cycle may be different than the peak value of the current in the second half of the current cycle.

During an OFF pulse, the DC voltage, $V_{216}$, from the power supply 216 is removed while the switch 220 is closed to circulate current within the bias supply 208 (Block 404). For example, as shown in FIG. 6, the power supply 216 may be turned off at a time, $t_{off}$, to create a short circuit to ground so that the asymmetric periodic voltage waveform quickly falls to zero volts. In addition, as shown by the voltage of the gate drive signal, $V_{240}$, in FIG. 6, the switch 220 is closed at the time, $t_{off}$, to circulate current, Ib, through the switch 220, the second inductor 214, and the power supply 216. In some modes of operation, the OFF pulse is short enough so that the current, Ib, circulated through the switch 220, the second inductor 214, and the power supply 216 does not completely decay to zero amps; thus, keeping the second inductor 214 partially energized. In other modes of operation, the current, Ib, does decay to zero amps during an OFF pulse.

In advance of another ON pulse, the power supply 216 is turned on to reapply the DC voltage, $V_{216}$ (Block 406). In this way, current, Ib, is injected into the second inductor 214 in advance of when the asymmetric periodic voltage is desired so that the asymmetric periodic voltage quickly rises. As shown in FIG. 6 for example, the power supply 216 is turned on at a time, $t_{dc\_on}$, which is a time, $t_{advance}$, before the switching action (the closing and opening) of the switch 220 begins at a time, $t_{switching\_on}$. It should be noted that the current, Ib, continues to be circulated within the bias supply after the DC voltage, $V_{216}$ is reapplied at $t_{dc\_on}$ until the switch-mode action of the switch 220 is initiated again at the time $t_{switching\_on}$. And as shown, the application of the voltage, $V_{216}$, at $t_{dc\_on}$ results in a substantial increase in the current, Ib, being injected in the second inductor 214; thus, enabling the periodic voltage waveform, $V_{210}$, to quickly reach its steady state parameter values.

It should be recognized that the switch 220 depicted herein generally represents one or more switches that are capable of closing and opening to connect and disconnect, respectively, a current pathway. For example, the switch 220 may be realized by a plurality of switches arranged is series (for enhanced voltage capability), may be realized by a plurality of switches arranged is parallel (for enhanced current capability), or the switch 220 may be comprised of a plurality of switches arranged in a series-parallel combination (for enhanced voltage and or current capability). In these variations, one of ordinary skill in the art will recognize that each switch that is used to realize the switch 220 may be synchronously driven by a corresponding drive signal.

In many implementations, the switch disclosed herein are realized by a field-effect switches such as metal-oxide semiconductor field-effect transistors (MOSFETS), and in some implementations, the switches are realized by silicon carbide metal-oxide semiconductor field-effect transistors (SiC MOSFETs) or gallium nitride metal-oxide semiconductor field-effect transistors (GaN MOSFETs). As another example, the switches may be realized by an insulated gate bipolar transistor (IGBT). In these implementations, the gate drive signal generator 636 may comprise an electrical driver known in the art that is configured to apply electrical drive signals to the switches responsive to signals from the timing parameter estimator 634 and/or the one or more compensators 632. It is also contemplated that the drive signals may be sent via optical lines to convey optical switching signals. And the switches may switch in response to the optical signal and/or optical signals that are converted to an electrical drive signal.

It should also be recognized that any of the diodes depicted herein may be realized by a plurality of diodes. For example, any diode may be realized by a plurality of series-connected diodes (to enhance voltage capability), may be realized by a plurality of diodes arranged in parallel (to enhance current capability), or may be comprised of a plurality of diodes arranged in a series-parallel combination (for enhanced voltage and or current capability).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC.

Figure 7:
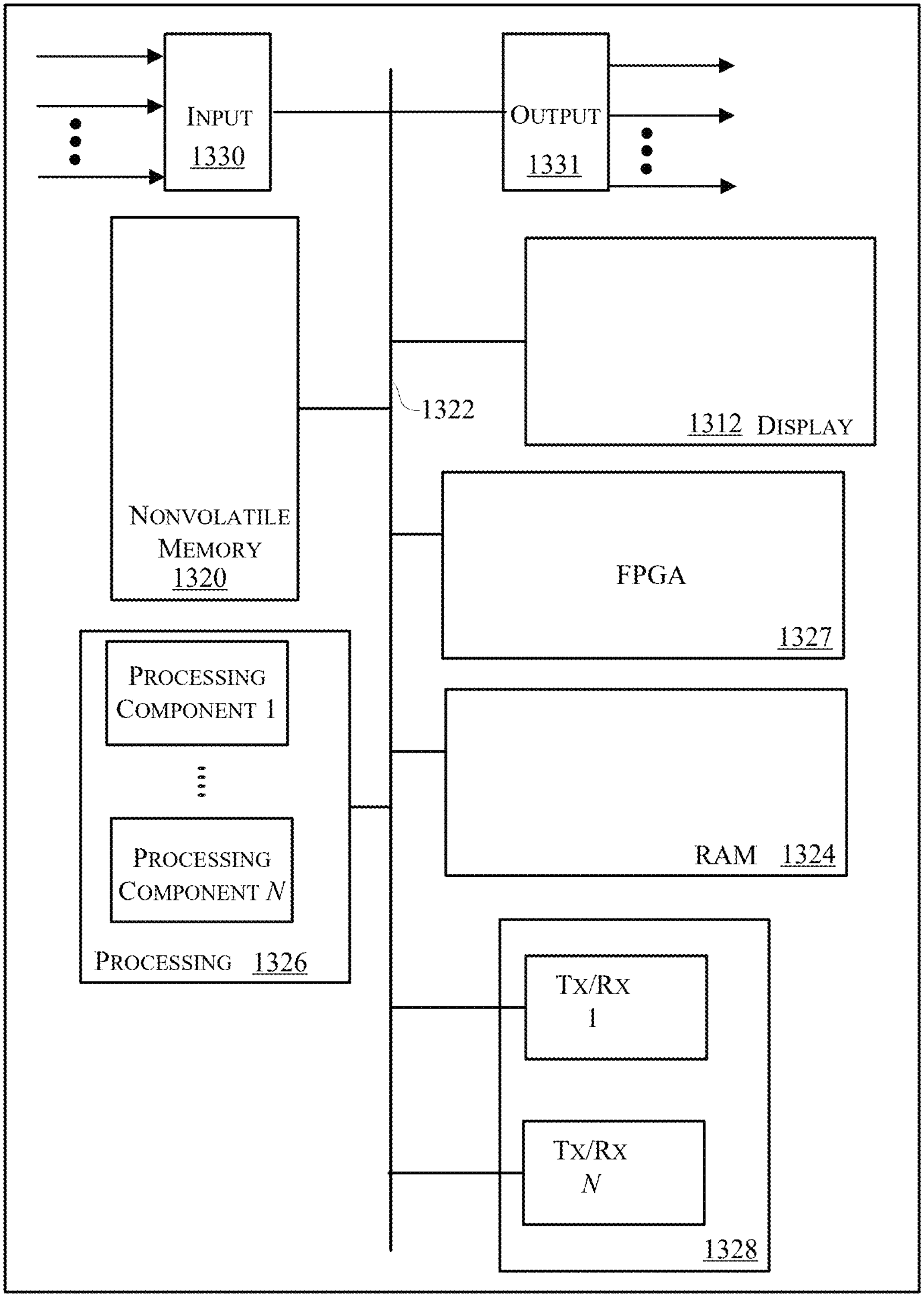
FIG. 7 is a diagram depicting components that may be utilized to implement control aspects disclosed herein.

Many embodiments and methods described herein may be realized using a processor in connection with processor executable instructions and a field programmable gate array (programmed by hardware description language instructions). The nonvolatile memory may be encoded with instructions that are executable by a processor and/or are readable by a field programmable gate array, e.g., to program the field programmable gate array. In some embodiments, the FPGA is used for high-speed processing and control, including switching control, measurement, pulsing, and multi-level operation while a processor is utilized for other lower-speed processing. Referring to FIG. 7 for example, shown is a block diagram depicting physical components of a controller that may be utilized to realize control aspects disclosed herein.

As shown, in this embodiment a display 1312 and nonvolatile memory 1320 are coupled to a bus 1322 that is also coupled to random access memory ("RAM") 1324, a processing portion (which includes N processing components) 1326, a field programmable gate array (FPGA) 1327, and a transceiver component 1328 that includes N transceivers. Although the components depicted in FIG. 7 represent physical components, FIG. 7 is not intended to be a detailed hardware diagram; thus, many of the components depicted in FIG. 7 may be realized by common constructs or distributed among additional physical components. Moreover, it is contemplated that other existing and yet-to-be developed physical components and architectures may be utilized to implement the functional components described with reference to FIG. 7.

This display 1312 generally operates to provide a user interface for a user, and in several implementations, the display is realized by a touchscreen display. In general, the nonvolatile memory 1320 is non-transitory memory that functions to store (e.g., persistently store) data and processor-executable code (including executable code that is associated with effectuating the methods described herein). In some embodiments for example, the nonvolatile memory 1320 includes bootloader code, operating system code, file system code, and non-transitory processor-executable code to facilitate the execution of methods for pulse-mode control of the bias supply 208 described herein. The nonvolatile memory 1320 may be encoded with instructions that are executable by a processor and/or are readable by a field programmable gate array, e.g., to program the field programmable gate array wherein the instructions (when executed by the processing portion 1326 or when effectuated by the FPGA 1327) cause the bias supply 208 to carry out the methods disclosed herein. Those of ordinary skill in the art will also appreciate that the FPGA 1327 may also comprise a non-transitory medium that is integrated with the FPGA.

In many implementations, the nonvolatile memory 1320 is realized by flash memory (e.g., NAND or ONENAND memory), but it is contemplated that other memory types may be utilized as well. Although it may be possible to execute the code from the nonvolatile memory 1320, the executable code in the nonvolatile memory is typically loaded into RAM 1324 and executed by one or more of the N processing components in the processing portion 1326.

The N processing components in connection with RAM 1324 generally operate to execute the instructions stored in nonvolatile memory 1320 to enable execution of the algorithms and functions disclosed herein. It should be recognized that several algorithms are disclosed herein, but some of these algorithms are not represented in flowcharts. Processor-executable code to effectuate methods described herein may be persistently stored in nonvolatile memory 1320 and executed by the N processing components in connection with RAM 1324. As one of ordinarily skill in the art will appreciate, the processing portion 1326 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, non-transitory FPGA-configuration-instructions may be persistently stored in non-volatile memory 1320 and accessed (e.g., during boot up) to configure a field programmable gate array (FPGA) to implement the algorithms disclosed herein.

The input component 1330 may receive power related signals (e.g., the signals 236, 238, and 240 indicative of Ib, output current, Iout, and voltage, V210) obtained (e.g., by current transducers, VI sensors, and/or voltage sensors. The input component 1330 may also receive the Sync_in signal. The output component 1331 may provide analog and/or digital signals to provide information or to provide control signals. As examples without limitation, the output component 1331 may provide the gate drive signal 240, the $V_{210\_control}$ signal, and the Sync_out signal.

Although not required, in some implementations the FPGA 1327 may sample the power-related signals and provide the digital representations of output current, Iout, and voltage $V_{210}$. In some embodiments, the processing components 1326 (in connection with processor-executable instructions stored in the nonvolatile memory 1320) are used to realize the data processing module, comparators, and compensators disclosed herein. But the FPGA 1327 may also be used to implement these functions. In addition, the input component 1330 may receive phase information and/or as discussed a synchronization signal between bias supplies 108 and source generator 112 that are indicative of one or more aspects of an environment within a plasma processing chamber 101 and/or synchronized control between a source generator and the single switch bias supply. The signals received at the input component 1330 may include, for example, synchronization signals, power control signals to the various generators and power supply units, or control signals from a user interface. Those of ordinary skill in the art will readily appreciate that any of a variety of types of sensors such as, without limitation, directional couplers and voltage-current (VI) sensors, may be used to sample power parameters, such as voltage and current, and that the signals indicative of the power parameters may be generated in the analog domain and converted to the digital domain.

The depicted transceiver component 1328 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

As used herein, the recitation of "at least one of A, B and C" or "at least one of A, B or C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A bias supply to produce a waveform, the apparatus comprising:

a switch in a current path that couples a first node to a second node;

a DC power supply coupled to the current path; and a controller comprising:

bias control logic configured to, while the DC power supply is applying power, repeatedly close and open the switch to produce peak voltages and portions between the peak voltages; and pulse-mode control logic configured to:

remove a DC voltage from the DC power supply; and while the power supply is not applying the DC voltage, close the at least one switch to circulate current through the switch and the DC power supply.

2. The bias supply of claim 1, wherein the controller is configured to control the power supply to apply power in advance of an ON pulse.

3. The bias supply of claim 2, wherein the controller is configured to receive a signal that indicates when the ON pulse begins.

4. The bias supply of claim 1, wherein the second node is coupled to the first node via a first inductor to form the current path.

5. The bias supply of claim 1, wherein the power supply is arranged in series with a second inductor, and the series arrangement of the power supply and the second inductor is coupled between the current path and the second node.

6. The bias supply of claim 5, wherein the current is circulated through the at least one switch, the second inductor, and the power supply.

7. The bias supply of claim 1, wherein the power supply is controllable to control current provided to the first node to control a ramped voltage between each of the peak voltages at the first node.

8. A method for producing a waveform comprising:
- applying, during an ON pulse, a waveform using switching of at least one a switch in connection with a DC voltage;
- removing the DC voltage and closing the at least one switch to circulate current during an OFF pulse;
- reapplying, in advance of another ON pulse, the DC voltage; and
- initiating the switching after reapplying the DC voltage to reapply the waveform during another ON pulse.

9. The method of claim 8, wherein applying the waveform comprises repeatedly coupling a voltage to, and decoupling the voltage from, a first node to produce peaks of the waveform.

10. The method of claim 9, wherein applying the waveform comprises repeatedly coupling the first node to, and decoupling the first node from, a second node via a switch and a first inductor to produce the peaks of the waveform.

11. The method of claim 10 comprising:
- providing the DC voltage to a second inductor to produce current to create a negative voltage ramp between each of the peaks of the waveform.

12. The method of claim 8, wherein each cycle of the waveform comprises a peak voltage, a voltage step following the peak voltage, and a ramped voltage following the voltage step.

13. The method of claim 8, wherein the DC voltage is a greater magnitude than −1000 volts.

14. A system, the system comprising:
- a source generator configured to apply pulsed power to a plasma chamber; and
- a bias supply configured to:
- apply, during an ON pulse of the source generator, a waveform using switching in connection with a DC voltage;
- removing the DC voltage while circulating current during an OFF pulse of the source generator;
- reapply, in advance of another ON pulse, the DC voltage; and
- initiating the switching after reapplying the DC voltage to reapply the waveform during the other ON pulse.

15. The system of claim 14, wherein the bias supply is configured to apply the waveform by repeatedly coupling a voltage to, and decoupling the voltage from, a first node to produce peaks of the waveform.

16. The system of claim 15, wherein the bias supply is configured to apply the waveform by repeatedly coupling the first node to, and decoupling the first node from, a second node via a switch and a first inductor to produce the peaks of the waveform.

17. The system of claim 16 wherein the bias supply is configured to provide the DC voltage to a second inductor to produce current to create a negative voltage ramp between each of the peaks of the waveform.

18. The system of claim 14, wherein each cycle of the waveform comprises a peak voltage, a voltage step following the peak voltage, and a ramped voltage following the voltage step.

19. The system of claim 14, wherein the DC voltage is a greater magnitude than −1000 volts.

* * * * *